(12) United States Patent
Howard

(10) Patent No.: US 11,145,572 B2
(45) Date of Patent: Oct. 12, 2021

(54) SEMICONDUCTOR STRUCTURE HAVING THROUGH-SUBSTRATE VIA (TSV) IN POROUS SEMICONDUCTOR REGION

(71) Applicant: Newport Fab, LLC, Newport Beach, CA (US)

(72) Inventor: David J. Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/703,367

(22) Filed: Dec. 4, 2019

(65) Prior Publication Data

US 2021/0111101 A1    Apr. 15, 2021

Related U.S. Application Data

(63) Continuation-in-part of application No. 16/598,803, filed on Oct. 10, 2019, and a continuation-in-part of application No. 16/597,779, filed on Oct. 9, 2019.

(51) Int. Cl.
| | |
|---|---|
| *H01L 23/48* | (2006.01) |
| *H01L 23/00* | (2006.01) |
| *H01L 21/768* | (2006.01) |
| *H01L 23/373* | (2006.01) |

(52) U.S. Cl.
CPC ...... *H01L 23/481* (2013.01); *H01L 21/76831* (2013.01); *H01L 21/76898* (2013.01); *H01L 23/3733* (2013.01); *H01L 23/562* (2013.01)

(58) Field of Classification Search
CPC . H01L 23/481; H01L 23/562; H01L 23/3733; H01L 23/48; H01L 23/00; H01L 23/373; H01L 21/768; H01L 21/76831; H01L 21/76898

USPC .......................................................... 257/728
See application file for complete search history.

(56) References Cited

U.S. PATENT DOCUMENTS

| | | | |
|---|---|---|---|
| 6,376,285 B1 | 4/2002 | Joyner et al. | |
| 7,420,201 B2 | 9/2008 | Langdo et al. | |
| 7,777,250 B2* | 8/2010 | Lochtefeld | ........ H01L 21/02538 257/190 |
| 9,385,023 B1 | 7/2016 | Cheng et al. | |
| 10,643,927 B1* | 5/2020 | Shank | ................. H01L 29/0649 |
| 2002/0175378 A1 | 11/2002 | Choe et al. | |
| 2004/0108552 A1 | 6/2004 | Azuma et al. | |
| 2004/0132267 A1* | 7/2004 | Sadana | ............... H01L 21/0245 438/510 |
| 2007/0108513 A1* | 5/2007 | Rub | .................... H01L 29/0653 257/329 |
| 2008/0034335 A1 | 2/2008 | Cheng et al. | |
| 2009/0212341 A1 | 8/2009 | Cheng et al. | |
| 2010/0203711 A1 | 8/2010 | Wang et al. | |
| 2013/0167915 A1 | 7/2013 | Moslehi et al. | |
| 2013/0171767 A1 | 7/2013 | Moslehi et al. | |

(Continued)

*Primary Examiner* — Alexander O Williams
(74) *Attorney, Agent, or Firm* — Farjami & Farjami LLP

(57) ABSTRACT

A semiconductor structure includes a semiconductor substrate, a porous semiconductor region within the semiconductor substrate, and through-substrate via (TSV) within the porous semiconductor region. The porous semiconductor region causes the semiconductor structure and/or the TSV to withstand thermal and mechanical stresses. Alternatively, the semiconductor structure includes a semiconductor buffer ring within the porous semiconductor region, and the TSV within the semiconductor buffer ring.

21 Claims, 25 Drawing Sheets

(56) References Cited

U.S. PATENT DOCUMENTS

| | | | |
|---|---|---|---|
| 2013/0249047 A1* | 9/2013 | Hung | H01L 21/76898 |
| | | | 257/506 |
| 2013/0279137 A1* | 10/2013 | Gardner | H01G 11/26 |
| | | | 361/782 |
| 2013/0288418 A1* | 10/2013 | Wang | H01L 31/035281 |
| | | | 438/68 |
| 2014/0061757 A1 | 3/2014 | Kim et al. | |
| 2014/0264630 A1* | 9/2014 | Huang | H01L 21/76898 |
| | | | 257/401 |
| 2015/0021698 A1 | 1/2015 | Ando et al. | |
| 2015/0137388 A1* | 5/2015 | Kim | H01L 23/562 |
| | | | 257/774 |
| 2015/0262911 A1* | 9/2015 | Chen | H01L 23/481 |
| | | | 257/757 |
| 2016/0020145 A1* | 1/2016 | Lee | H01L 21/3083 |
| | | | 438/400 |
| 2016/0336428 A1 | 11/2016 | Cheng et al. | |
| 2017/0352592 A1* | 12/2017 | Farooq | H01L 28/92 |
| 2018/0166475 A1* | 6/2018 | Chen | H01L 27/1463 |
| 2018/0226471 A1 | 8/2018 | Hille et al. | |
| 2018/0277632 A1 | 9/2018 | Fanelli et al. | |
| 2018/0337211 A1 | 11/2018 | Su et al. | |
| 2019/0002275 A1* | 1/2019 | Chang | B81C 1/00095 |
| 2019/0148570 A1 | 5/2019 | Wu et al. | |
| 2020/0212383 A1* | 7/2020 | Collins | H01M 50/213 |
| 2020/0212492 A1* | 7/2020 | Collins | H01M 50/411 |
| 2020/0335826 A1* | 10/2020 | Collins | H01M 4/78 |

\* cited by examiner

US 11,145,572 B2

1

SEMICONDUCTOR STRUCTURE HAVING THROUGH-SUBSTRATE VIA (TSV) IN POROUS SEMICONDUCTOR REGION

CLAIMS OF PRIORITY

The present application is a continuation-in-part of and claims the benefit of and priority to application Ser. No. 16/597,779 filed on Oct. 9, 2019 and titled "Semiconductor Structure Having Porous Semiconductor Layer for RF Devices,". The present application is also a continuation-in-part of and claims the benefit of and priority to application Ser. No. 16/598,803 filed on Oct. 10, 2019, titled "Semiconductor Structure Having Porous Semiconductor Segment for RF Devices and Bulk Semiconductor Region for Non-RF Devices,". The disclosures and contents of the above-identified applications are hereby incorporated fully by reference into the present application.

BACKGROUND

As known in the art, through-silicon (or through-substrate) vias (TSVs) generally pass through the entire bulk silicon substrate, and are utilized to, for example, create robust electrical connections. In "3D" integrated circuits where a semiconductor die connects to a printed circuit board or to another stacked semiconductor die, numerous TSVs might be used. However, TSVs have a high coefficient of thermal expansion (CTE) compared to bulk silicon; for example, approximately seventeen parts per million per degree Celsius (17 ppm/° C.) versus approximately three parts per million per degree Celsius (3 ppm/° C.), respectively. When the semiconductor structure is subjected to high temperatures, such as during operation of power amplifiers, during high ambient temperatures, or during BEOL processing utilized to form metallizations and other structures, this CTE mismatch increases the susceptibility of the semiconductor structure to thermal stresses. Also, significant shifts in ambient temperatures, i.e. temperatures getting too low or too high, may place the semiconductor structure under thermal stress. These thermal stresses could cause a variety of defects, such as cracking, metal diffusion, and/or current crowding.

Bulk silicon is also relatively rigid, and may have a Young's modulus of elasticity of approximately one hundred sixty gigapascals (160 GPa). The semiconductor structure with the TSVs may not withstand mechanical stresses when subjected to high forces, such as forces from chemical machine polishing (CMP) utilized to form metallizations and other structures, or forces from a semiconductor packaging process. These mechanical stresses could also cause cracking and other defects, just as thermal stresses would.

Thus, there is need in the art for robust semiconductor structures including TSVs that effectively withstand thermal and mechanical stresses.

SUMMARY

The present disclosure is directed to a semiconductor structure having a through-substrate via (TSV) in a porous semiconductor region, substantially as shown in and/or described in connection with at least one of the figures, and as set forth in the claims.

DETAILED DESCRIPTION

Figure 1:
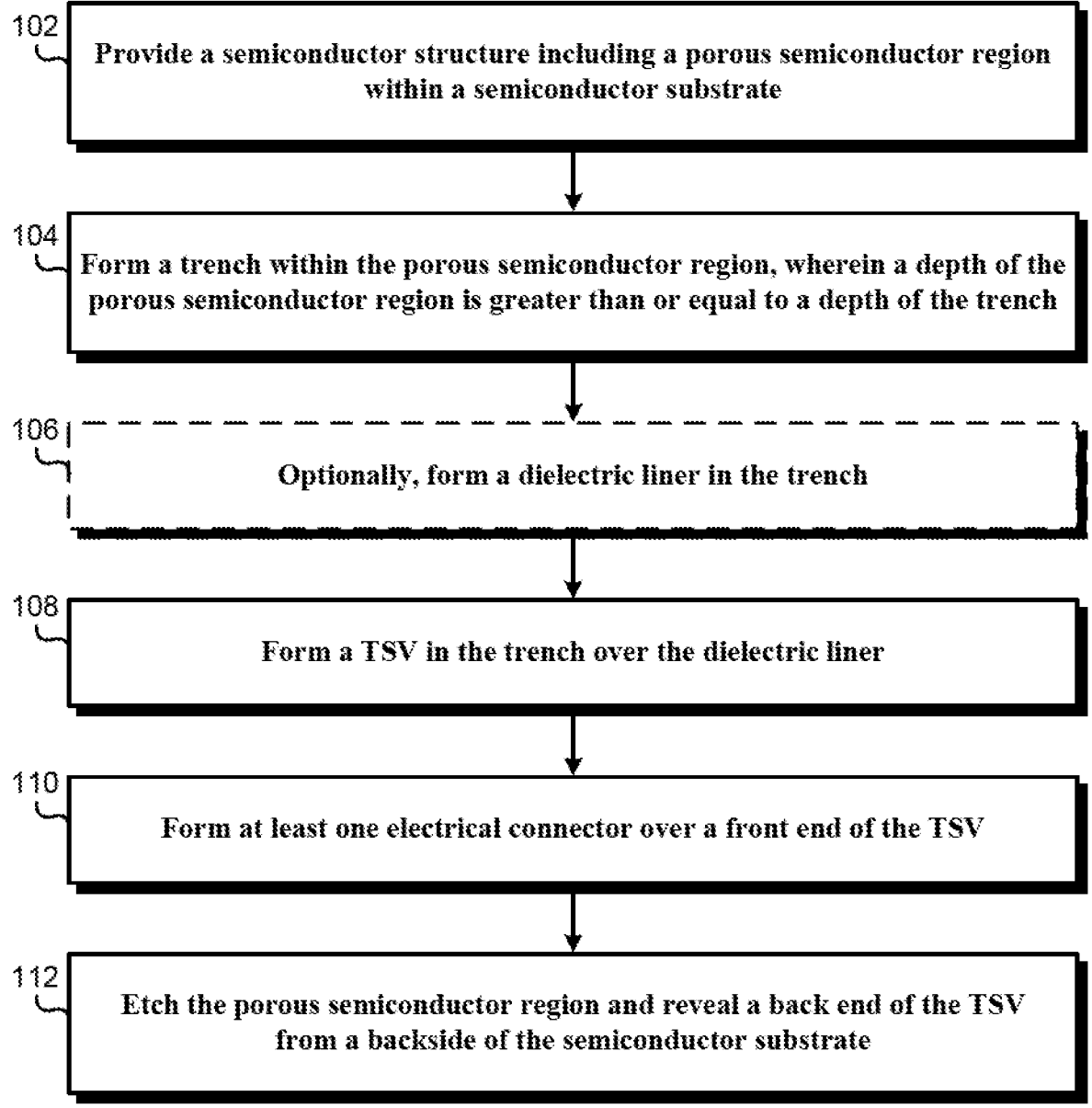
FIG. 1 illustrates a flowchart of an exemplary method for manufacturing a semiconductor structure according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 2A:
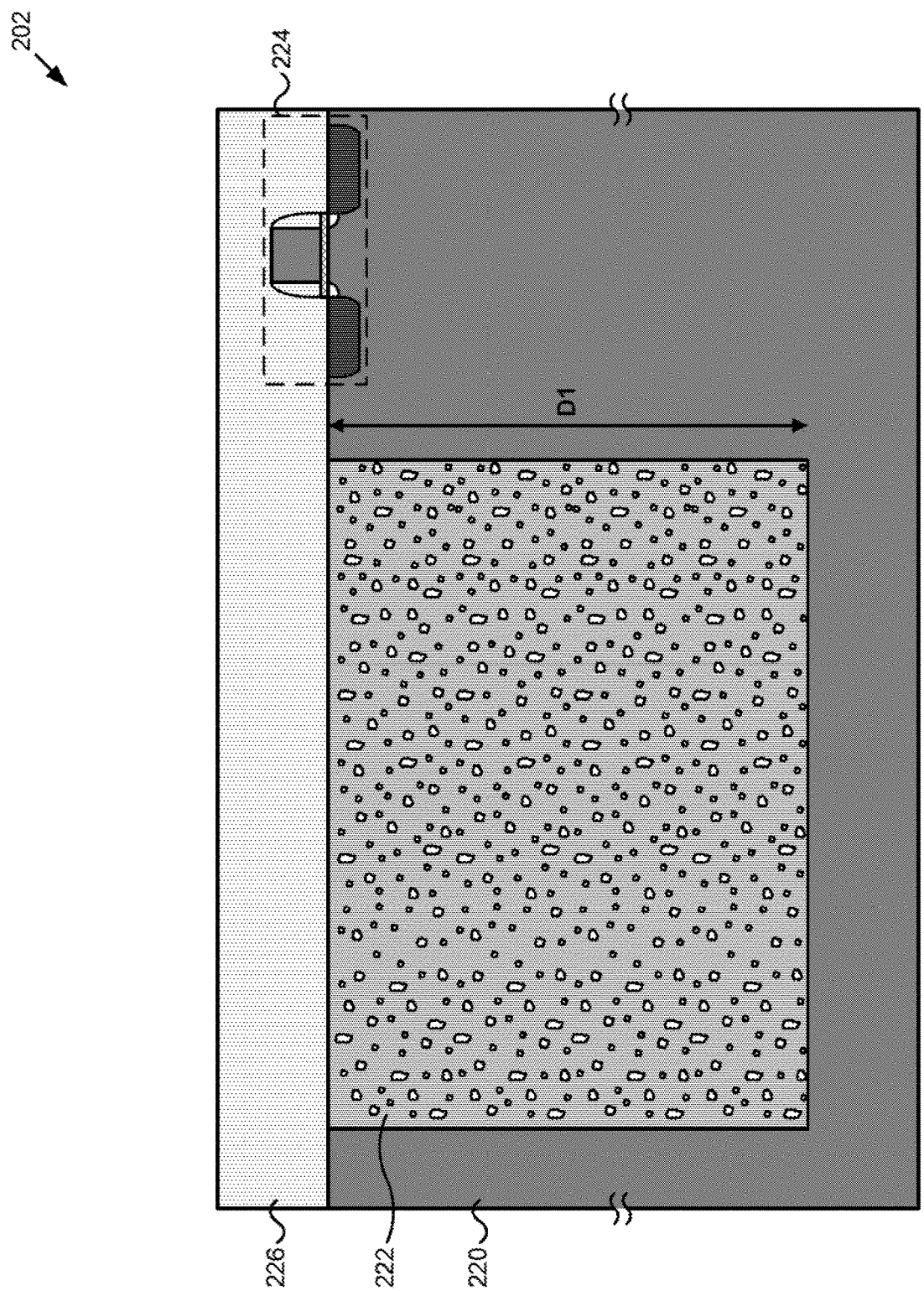
FIG. 2A illustrates a cross-sectional view of a portion of a semiconductor structure processed in accordance with the flowchart of FIG. 1 according to one implementation of the present application.
Figure 2B:
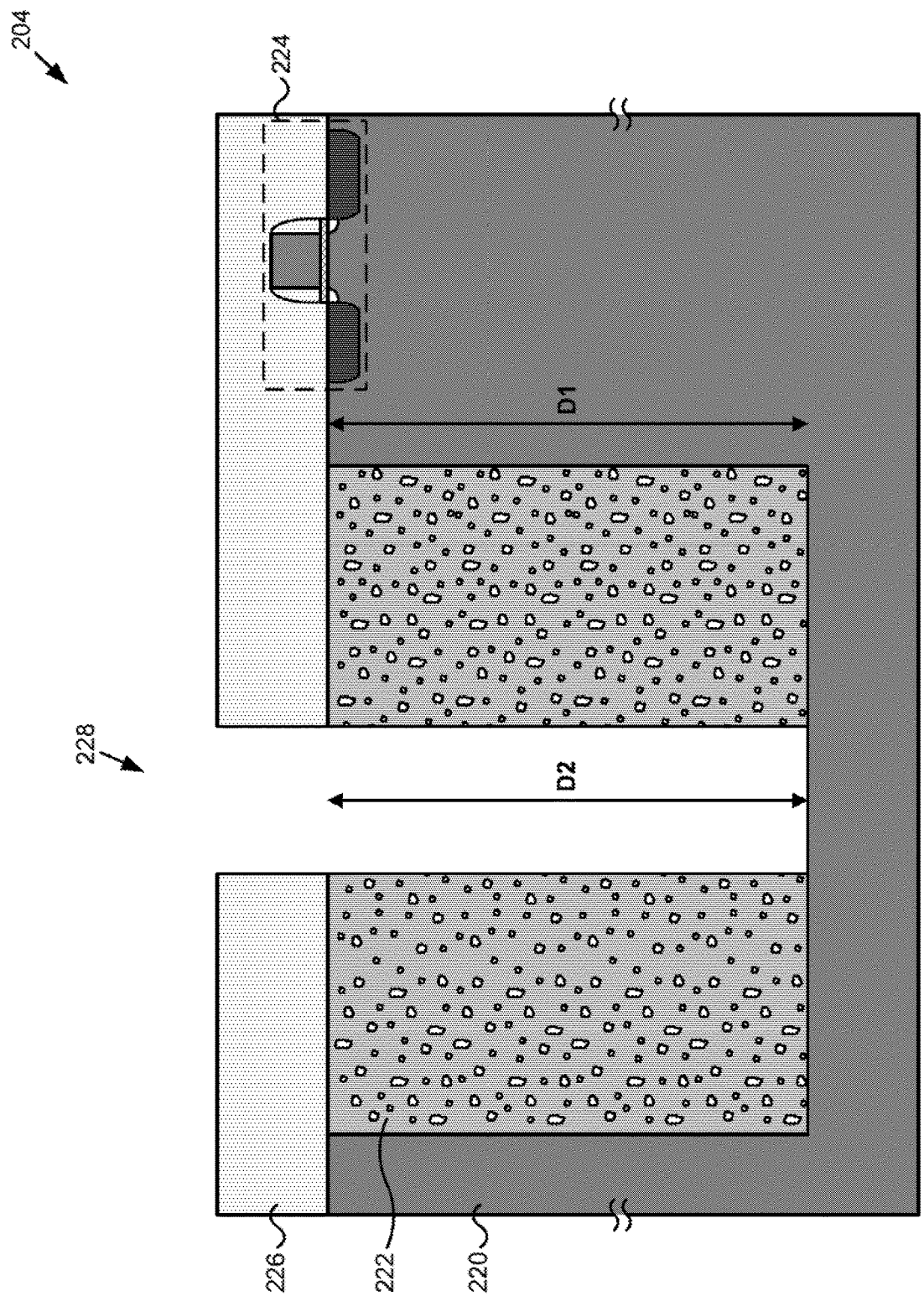
FIG. 2B illustrates a cross-sectional view of a portion of a semiconductor structure processed in accordance with the flowchart of FIG. 1 according to one implementation of the present application.

FIG. 1 illustrates a flowchart of an exemplary method for manufacturing a semiconductor structure according to one implementation of the present application. Structures shown in FIGS. 2A through 2G illustrate the results of performing actions 102 through 112 shown in the flowchart of FIG. 1. For example, FIG. 2A shows a semiconductor structure after performing action 102 in FIG. 1, FIG. 2B shows a semiconductor structure after performing action 104 in FIG. 1, and so forth.

Actions 102 through 112 shown in the flowchart of FIG. 1 are sufficient to describe one implementation of the present inventive concepts. Other implementations of the present inventive concepts may utilize actions different from those shown in the flowchart of FIG. 1. Certain details and features have been left out of the flowchart of FIG. 1 that are apparent to a person of ordinary skill in the art. For example, an action may consist of one or more sub-actions or may involve specialized equipment or materials, as known in the art. Moreover, some actions, such as masking and cleaning actions, may be omitted so as not to distract from the illustrated actions.

FIG. 2A illustrates a cross-sectional view of a portion of a semiconductor structure processed in accordance with the flowchart of FIG. 1 according to one implementation of the present application. As shown in FIG. 2A, semiconductor structure 202 is provided. Semiconductor structure 202 includes bulk silicon substrate 220, porous silicon region 222, semiconductor device 224, and interlayer dielectric 226.

In the present implementation, bulk silicon substrate 220 is a P− or P+ type single crystal silicon substrate. In various implementations, bulk silicon substrate 220 may be any other type of substrate. For example, bulk silicon substrate 220 can comprise germanium (Ge). In various implementations, bulk silicon substrate 220 can have a thickness of approximately seven hundred microns (700 µm) or greater or less.

Porous silicon region 222 is situated within bulk silicon substrate 220. Porous silicon region 222 is a silicon region having voids, or pores, therein. Within porous silicon region 222, the pores can have any orientation, branching, fill, or other morphological characteristic known in the art. Porous silicon region 222 can be formed by using a top-down technique, where portions of bulk silicon substrate 220 are removed to generate pores. In one implementation, a hardmask is formed over bulk silicon substrate 220 to expose a segment thereof. Then, porous silicon region 222 is formed by electrochemical etching the exposed segment of bulk silicon substrate 220 using hydrofluoric acid (HF). Alternatively, porous silicon region 222 can be formed by stain etching, photoetching, or any other top-down technique known in the art.

In various implementations, porous silicon region 222 can also be formed by using a bottom-up technique, where deposition results in a silicon region having voids. For example, porous silicon region 222 can be formed by low-temperature high-density plasma (HDP) deposition, plasma hydrogenation of an amorphous layer, laser ablation, or any other bottom-up technique known in the art. Depth D1 represents the depth of porous silicon region 222 measured from the top surface of bulk silicon substrate 220. In various implementations, depth D1 of porous silicon region 222 can be approximately two hundred fifty microns (250 µm). In various implementations, porous silicon region 222 can have any other depth. In various implementations, porous silicon region 222 may be a semiconductor material other than silicon.

Semiconductor structure 202 includes semiconductor device 224. In the present implementation, semiconductor device 224 is a transistor. In various implementations, semiconductor device 224 can be a power amplifier, a filter, a mixer, a diode, or a micro-electromechanical systems (MEMS) device. In various implementations, semiconductor device 224 can be an active circuit comprising multiple active devices, or comprising passive devices in combination with at least one active device. As described below, semiconductor device 224 can be a source of stress in semiconductor structure 202.

Interlayer dielectric 226 is situated over bulk silicon substrate 220, porous silicon region 222, and semiconductor device 224. Interlayer dielectric 226 can comprise, for example, silicon dioxide ($SiO_2$), phosphosilicate glass (PSG), or another dielectric. Interlayer dielectric 226 and semiconductor device 224 can correspond to a front-end-of-line (FEOL) in an integrated circuit (IC) process. Electrical connectors (not shown in FIG. 2A) for connecting to semiconductor device 224 can be situated in interlayer dielectric 226.

FIG. 2B illustrates a cross-sectional view of a portion of a semiconductor structure processed in accordance with action 104 in the flowchart of FIG. 1 according to one implementation of the present application. As shown in FIG. 2B, in semiconductor structure 204, trench 228 is formed in porous silicon region 222.

Trench 228 extends through interlayer dielectric 226 and into porous silicon region 222. In one implementation, trench 228 is formed using a fluorine-based anisotropic etch. In another implementation, trench 228 is formed using the Bosch etch process known in the art. Notably, because the etch rate of porous silicon is generally faster than the etch rate of bulk silicon, trench 228 formed in porous silicon region 222 can be formed faster than a trench formed in bulk silicon.

Depth D2 represents the depth of trench 228 measured fro the top surface of bulk silicon substrate 220 that may or may not be as great as depth D1 of porous silicon region 222. In the present implementation, depth D1 of porous silicon region 222 in bulk silicon substrate 220 is substantially equal to depth D2 of trench 228. Alternatively, depth D1 of porous silicon region 222 can be greater than depth D2 of trench 228. The timing of an etching action utilized to form trench 228 can be shortened to ensure that depth D1 of porous silicon region 222 is greater than depth D2 of trench 228. In various implementations, depth D2 of trench 228 can range from approximately fifty microns to approximately two hundred fifty microns (50 μm-250 μm), while a width of trench 228 can range from approximately three microns to approximately fifty microns (3 μm-50 μm). In various implementations, the aperture of trench 228 (not shown in FIG. 2B) can have a circular shape, a rectangular shape, or any other shape.

In FIG. 2B, trench 228 is formed after semiconductor device 224 and interlayer dielectric 226, but before any interconnect metal levels of a back-end-of-line multi-level metallization (BEOL MLM). In one implementation, trench 228 can be formed before semiconductor device 224 and interlayer dielectric 226. In this implementation, trench 228 can extend through porous silicon region 222, without extending through interlayer dielectric 226. In another implementation, trench 228 can be formed as part of a BEOL MLM (not shown in FIG. 2B) situated over interlayer dielectric 226. For example, trench 228 can extend from a third interconnect metal level (i.e., M3) into porous silicon region 222. In yet another implementation, trench 228 can be formed after a BEOL MLM (not shown in FIG. 2B).

Figure 2C:
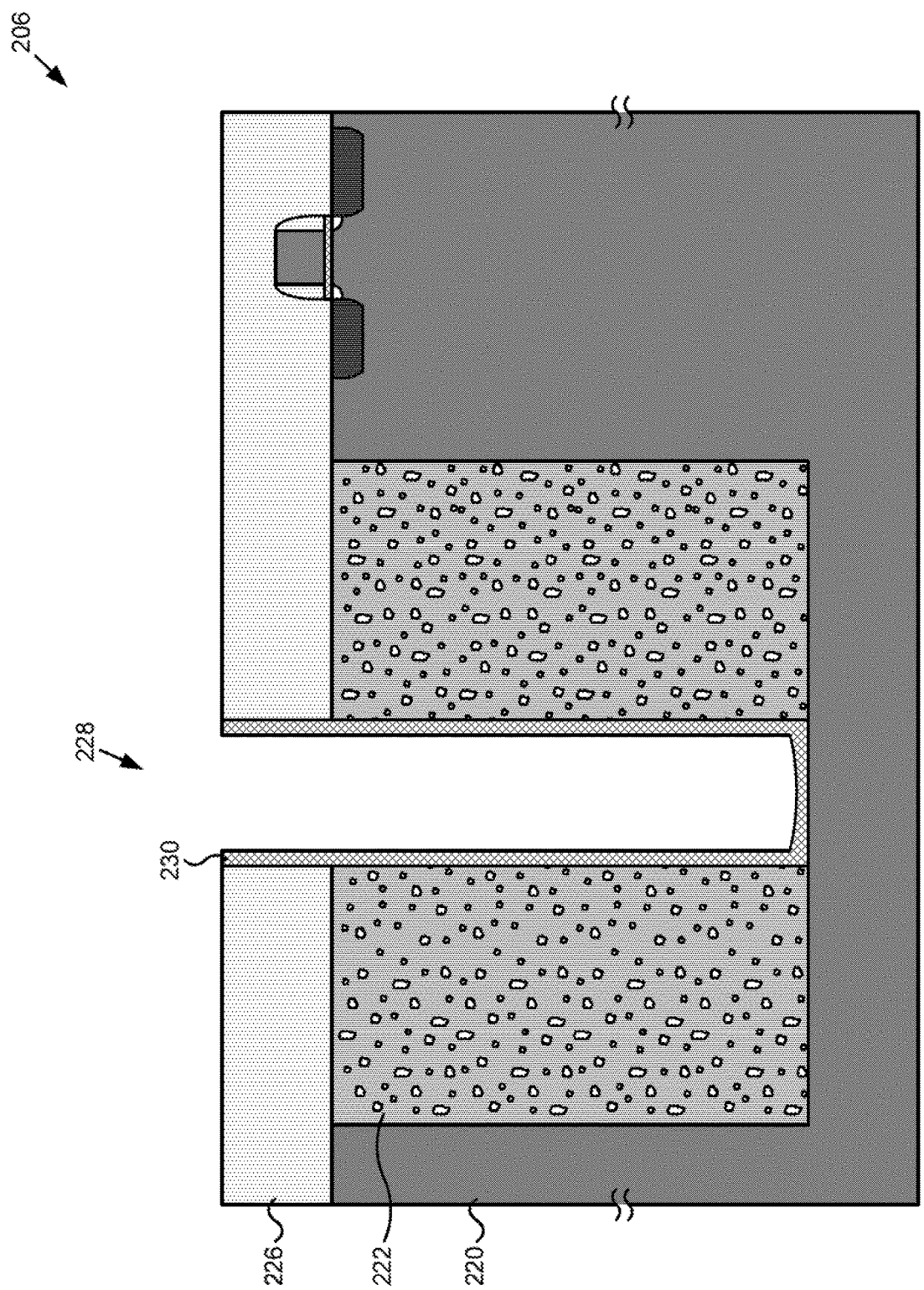
FIG. 2C illustrates a cross-sectional view of a portion of a semiconductor structure processed in accordance with the flowchart of FIG. 1 according to one implementation of the present application.

FIG. 2C illustrates a cross-sectional view of a portion of a semiconductor structure processed in accordance with action 106 in the flowchart of FIG. 1 according to one implementation of the present application. As shown in FIG. 2C, in semiconductor structure 206, dielectric liner 230 is formed in trench 228.

Dielectric liner 230 lines trench 228. As shown in FIG. 2C, dielectric liner 230 is formed over porous silicon region 222 and interlayer dielectric 226 along sidewalls of trench 228, and over bulk silicon substrate 220 at a bottom of trench 228. Dielectric liner 230 can be formed, for example, by plasma enhanced chemical vapor deposition (PECVD) or high density plasma CVD (HDP-CVD). Dielectric liner 230 can comprise, for example, silicon oxide ($Si_xO_y$). In various implementations, dielectric liner 230 is a low-k dielectric. In one implementation, the thickness of dielectric liner 230 can range from approximately two hundred angstroms to approximately five hundred angstroms (200 Å-500 Å).

Where depth D1 (shown in FIG. 2B) of porous silicon region 222 is greater than depth D2 (shown in FIG. 2B) of trench 228, dielectric liner 230 can be formed over porous silicon region 222 at a bottom of trench 228, rather than over bulk silicon substrate 220. As shown in FIG. 2C, dielectric liner 230 is planarized with interlayer dielectric 226. In other implementations, segments of dielectric liner 230 can remain over interlayer dielectric 226. Dielectric liner 230 is considered optional in that semiconductor structures according to the present application can be formed without dielectric liner 230.

Figure 2D:
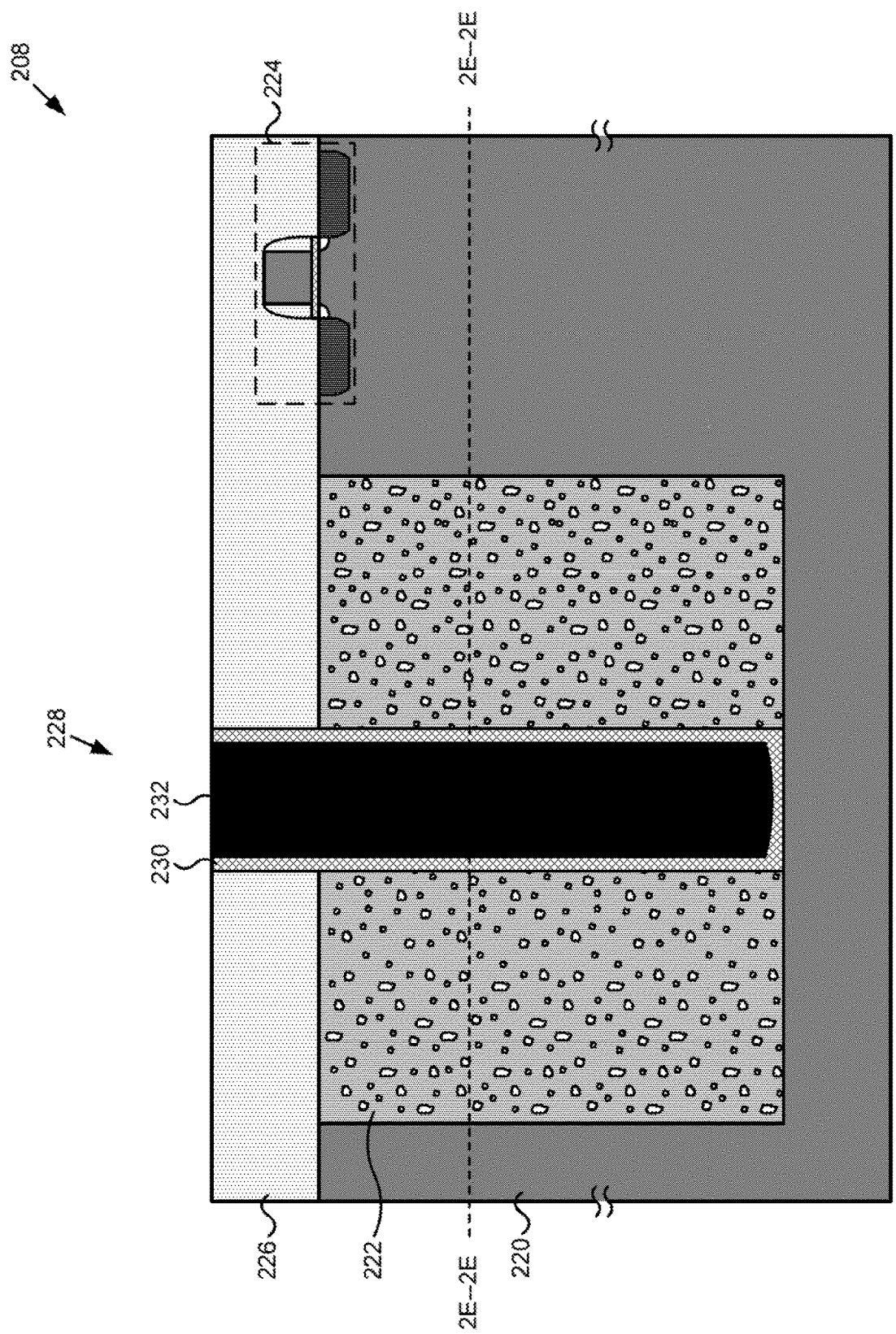
FIG. 2D illustrates a cross-sectional view of a portion of a semiconductor structure processed in accordance with the flowchart of FIG. 1 according to one implementation of the present application.

FIG. 2D illustrates a cross-sectional view of a portion of a semiconductor structure processed in accordance with action 108 in the flowchart of FIG. 1 according to one implementation of the present application. As shown in FIG. 2D, in semiconductor structure 208, through-substrate via (TSV) 232 is formed in trench 228 over dielectric liner 230.

TSV 232 can be formed, for example, by a damascene process. TSV 232 can comprise, for example, copper (Cu), aluminum (Al), or titanium (Ti). As shown in FIG. 2D, TSV 232 is planarized with interlayer dielectric 226. In other implementations, segments of a metal utilized to form TSV 232 can remain over interlayer dielectric 226 and/or dielectric liner 230. In various implementations, a barrier layer (not shown in FIG. 2D) can be formed prior to TSV 232.

In FIG. 2D, porous silicon region 222 has a coefficient of thermal expansion (CTE) that more closely matches a CTE of TSV 232, compared to a CTE of bulk silicon substrate 220. For example, bulk silicon substrate 220 may have a CTE of approximately three parts per million per degree Celsius (3 ppm/° C.), whereas TSV 232 comprising copper may have a CTE of approximately seventeen parts per million per degree Celsius (17 ppm/° C.). This CTE mismatch increases the susceptibility of semiconductor structure 208 and/or TSV 232 to thermal stresses. However, CTE of porous silicon is significantly greater than bulk silicon. As such, if porous silicon region 222 were not used, semiconductor structure 208 and/or TSV 232 may not withstand thermal stresses when subjected to high temperatures, such as during operation of semiconductor device 224, during high ambient temperatures, or during BEOL processing utilized to form metallizations and other structures over semiconductor structure 208. Also, significant shifts in ambient temperatures, temperatures getting too low or too high, may place semiconductor structure 208 under thermal stress. These thermal stresses could cause a variety of defects, such as cracking of TSV 232, dielectric liner 230, and/or bulk silicon substrate 220, or metal diffusion of TSV 232 into bulk silicon substrate 220. In contrast, porous silicon region 222 has a CTE significantly greater than the CTE of bulk silicon substrate 220. The CTE of porous silicon region 222 more closely matches the CTE of TSV 232. Accordingly, because TSV 232 is situated within porous silicon region 222, porous silicon region 222 causes semiconductor structure 208 and/or TSV 232 to withstand thermal stresses.

Porous silicon region 222 is also more deformable than bulk silicon substrate 220. For example, bulk silicon substrate 220 may be relatively rigid and have a Young's modulus of elasticity of approximately one hundred sixty gigapascals (160 GPa), whereas porous silicon region 222 may be relatively deformable and have a Young's modulus of elasticity of approximately sixty gigapascals (60 GPa). For porous silicon region 222, deformability generally increases as porosity increases. If porous silicon region 222 were not used, semiconductor structure 208 and/or TSV 232 may not withstand mechanical stresses when subjected to high forces, such as forces from chemical machine polishing (CMP) utilized to form metallizations and other structures, or forces from a semiconductor packaging process. These mechanical stresses could cause cracking of TSV 232, dielectric liner 230, and/or bulk silicon substrate 220. In contrast, porous silicon region 222 is more deformable than bulk silicon substrate 220. Accordingly, because TSV 232 is situated within porous silicon region 222, porous silicon region 222 causes semiconductor structure 208 and/or TSV 232 to withstand mechanical stresses.

Further, porous silicon region 222 reduces signal leakage and parasitic capacitive coupling between TSV 232 and bulk silicon substrate 220. Pores in porous silicon region 222 decrease its effective dielectric constant and increase its resistivity. In semiconductor structure 208 in FIG. 2D, porous silicon region 222 has a dielectric constant significantly less than the dielectric constant of bulk silicon substrate 220. For example, bulk silicon substrate 220 may have a dielectric constant of approximately 11.7, and porous silicon region 222 may have a dielectric constant significantly less than 11.7. In particular, porous silicon region 222 can have a dielectric constant from approximately 2.0 to approximately 4.0. As a result, in various implementations, dielectric liner 230 can be kept thin or not used altogether.

Figure 2E:
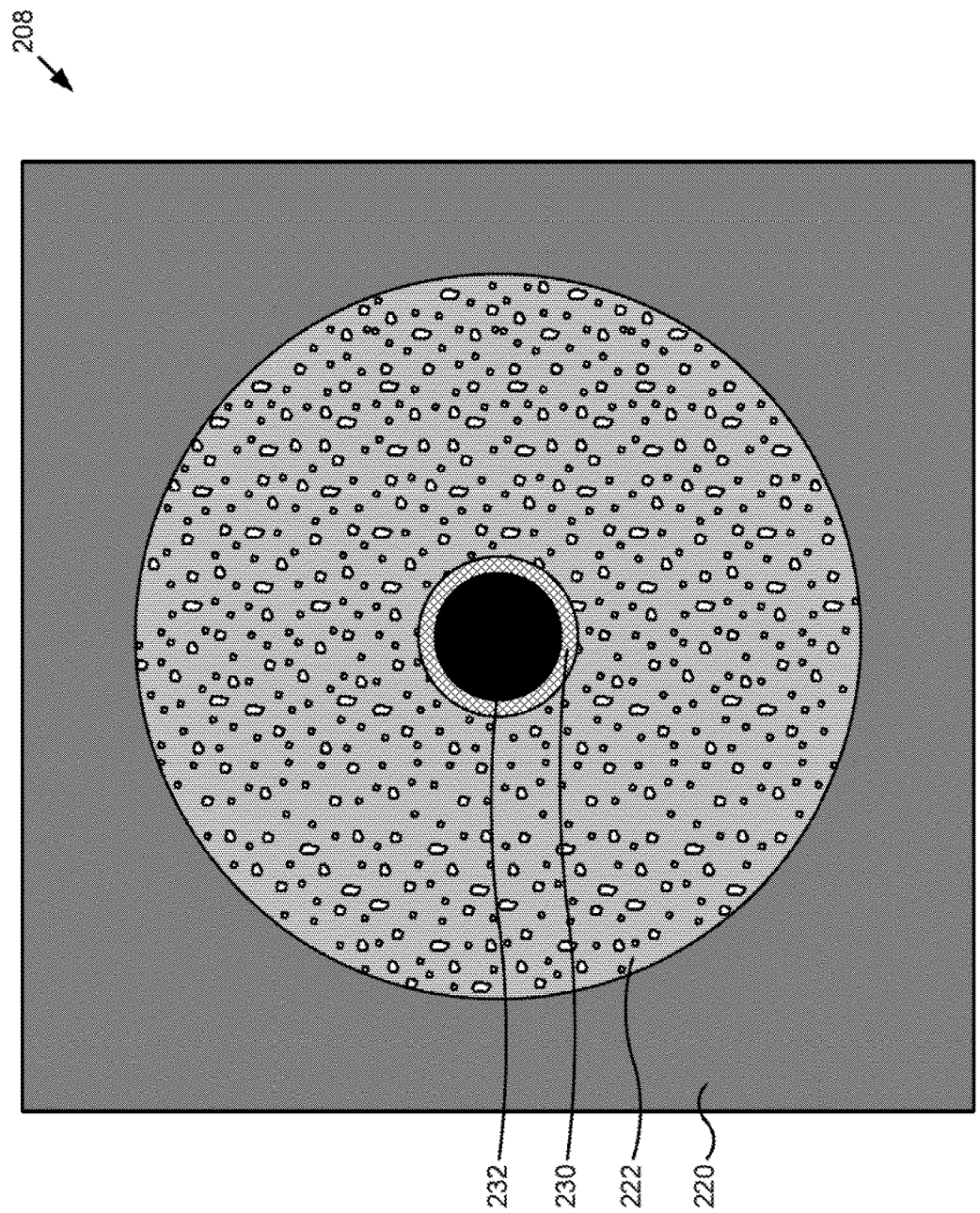
FIG. 2E illustrates a top cross-sectional view of a portion of a semiconductor structure corresponding to the semiconductor structure in FIG. 2D according to one implementation of the present application.

FIG. 2E illustrates a top cross-sectional view of a portion of a semiconductor structure corresponding to the semiconductor structure in FIG. 2D according to one implementation of the present application. FIG. 2E represents a cross-sectional view along line "2E-2E" in FIG. 2D.

As shown in FIG. 2E, semiconductor structure 208 includes bulk silicon substrate 220, porous silicon region 222, dielectric liner 230, and TSV 232. Porous silicon region 222 is situated within bulk silicon substrate 220, and TSV 232 is situated within porous silicon region 222. As described above, because porous silicon region 222 provides better CTE matching with TSV 232 compared to bulk silicon substrate 220, and because porous silicon region 222 is more deformable compared to bulk silicon substrate 220, porous silicon region 222 causes semiconductor structure 208 and/or TSV 232 to withstand thermal and mechanical stresses. In the present implementation, porous silicon region 222, dielectric liner 230, and TSV 232 have a substantially circular shape. In various implementations, porous silicon region 222, dielectric liner 230, and TSV 232 can have a rectangular shape, or any other shape.

Figure 2F:
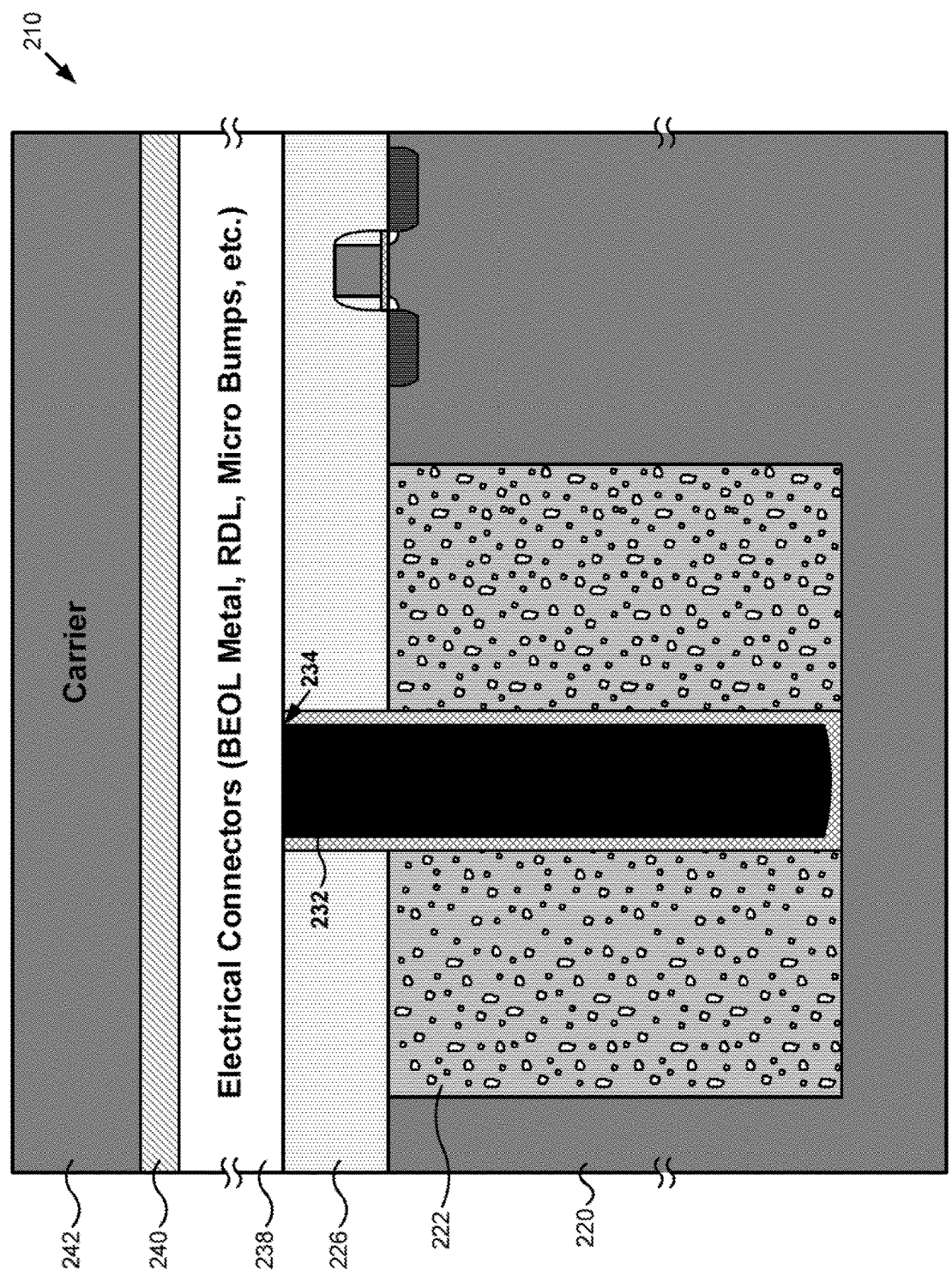
FIG. 2F illustrates a cross-sectional view of a portion of a semiconductor structure processed in accordance with the flowchart of FIG. 1 according to one implementation of the present application.

FIG. 2F illustrates a cross-sectional view of a portion of a semiconductor structure processed in accordance with action 110 in the flowchart of FIG. 1 according to one implementation of the present application. As shown in FIG. 2F, in semiconductor structure 210, electrical connection layer 238 is formed over TSV 232 and over interlayer dielectric 226. Electrical connection layer 238 contains at least one electrical connector situated over front end 234 of TSV 232.

Electrical connection layer 238 can comprise generally any BEOL MLM suitable for semiconductor devices. Electrical connection layer 238 can also comprise a redistribution layer (RDL), micro bumps, and/or contact pads. Electrical connection layer 238 can also comprise a plurality of devices, such as integrated passive devices (IPDs; not shown in FIG. 2F). Electrical connection layer 238 can be much larger than shown in FIG. 2F.

Any electrical connector in electrical connection layer 238 can be situated over front end 234 of TSV 232. For example, in one implementation, TSV 232 can be formed as part of a BEOL MLM, and a third interconnect metal (i.e., M3) can be situated over front end 234 of TSV 232. As another example, in one implementation, TSV 232 can be formed before interlayer dielectric 226, and another via or an IPD can be situated over front end 234 of TSV 232. As yet another example, in one implementation, TSV 232 can be formed after a BEOL MLM, and a redistribution metal or a micro bump can be situated over front end 234 of TSV 232. In various implementations, the electrical connector situated over front end 234 of TSV 232 can comprise, for example, Cu, Al or Ti.

As described above, semiconductor structure 210 and/or TSV 232 can experience thermal and mechanical stresses. If porous silicon region 222 were not used, these stresses could cause defects in an electrical connector situated over front end 234 of TSV 232 in electrical connection layer 238. For example, thermal expansion of TSV 232 could create a shear force in a micro bump situated over front end 234 of TSV 232 and cause the micro bump to crack, which could also lead to current crowding. Although larger electrical connectors can be utilized to help withstand stress, using larger electrical connectors also prohibits downsizing and reduces interconnect density. Moreover, in "3D" integrated circuits where semiconductor structure 210 connects to a printed circuit board or to another stacked semiconductor structure, numerous TSVs might be used, exacerbating these effects. In semiconductor structure 210 in FIG. 2F, because TSV 232 is situated within porous silicon region 222, porous silicon region 222 causes electrical connectors in electrical connection layer 238 to withstand thermal and mechanical stresses, without reducing interconnect density.

As shown in FIG. 2F, electrical connection layer 238 is temporarily bonded with carrier wafer 242 by bonding layer 240. In various implementations, carrier wafer 242 can be glass, quartz, or silicon. In various implementations, bonding layer 240 is a curable polymeric adhesive or a thermoplastic adhesive utilized to bond electrical connection layer 238 with carrier wafer 242. Alternatively, electrical connection layer 238 can be bonded with carrier wafer 242 using any other bonding technique known in the art. Carrier wafer 242 allows semiconductor structure 210 to be flipped such that carrier wafer 242 is on bottom and bulk silicon substrate 220 is on top, to allow subsequent fabricating actions to be performed on bulk silicon substrate 220.

Figure 2G:
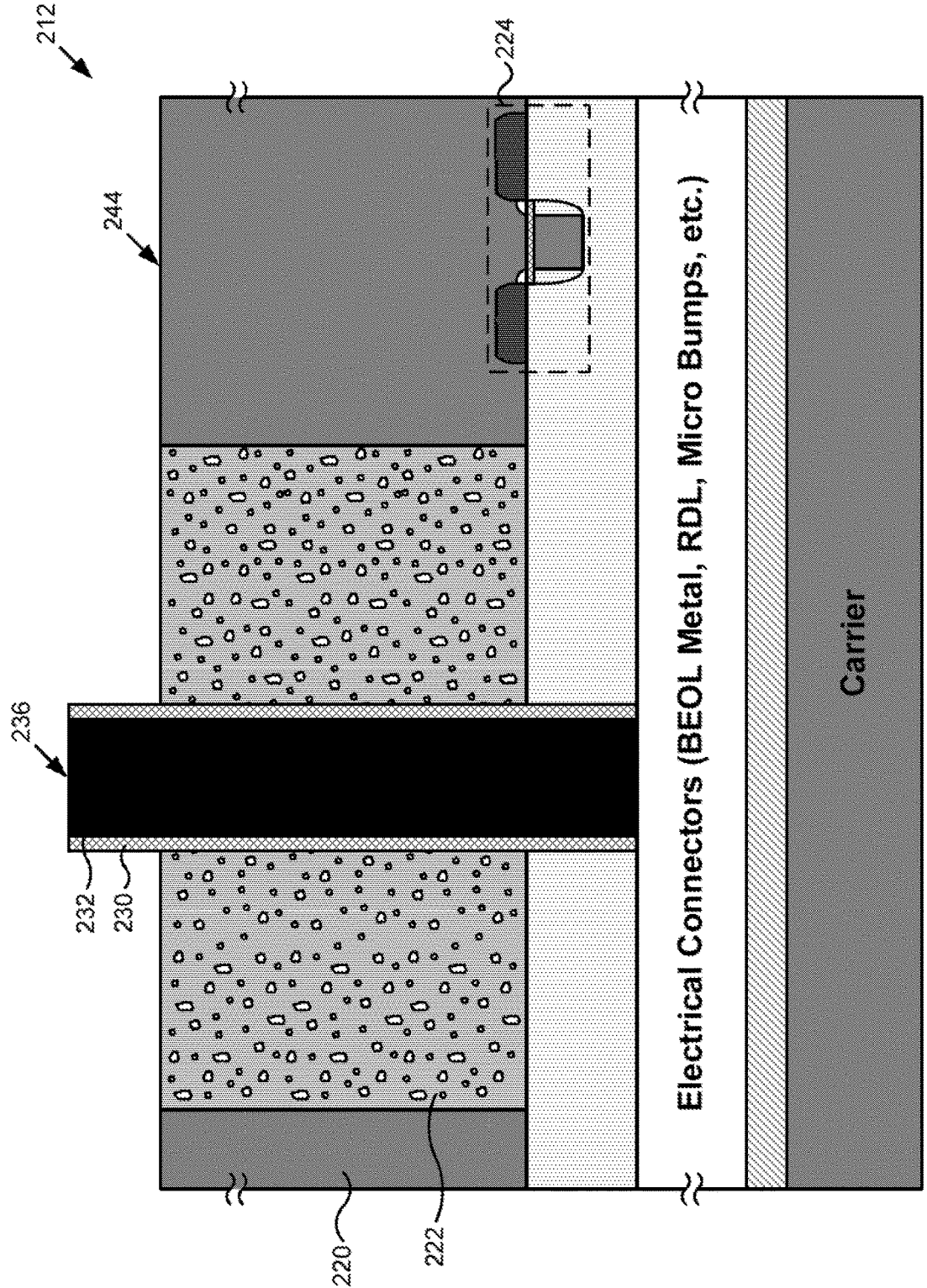
FIG. 2G illustrates a cross-sectional view of a portion of a semiconductor structure processed in accordance with the flowchart of FIG. 1 according to one implementation of the present application.

FIG. 2G illustrates a cross-sectional view of a portion of a semiconductor structure processed in accordance with action 112 in the flowchart of FIG. 1 according to one implementation of the present application. As shown in FIG. 2G, in semiconductor structure 212, porous silicon region 222 and bulk silicon substrate 220 are both etched, and back end 236 of TSV 232 is revealed from backside 244 of bulk silicon substrate 220.

Bulk silicon substrate 220 can be thinned using a wafer grind and/or CMP prior to revealing back end 236 of TSV 232. Then, a wet etch, for example, using potassium hydroxide (KOH) or tetramethylammonium hydroxide (TMAH), or a dry plasma etch, for example, using sulfur hexafluoride (SF6), can be utilized to etch porous silicon region 222 and bulk silicon substrate 220 without etching dielectric liner 230 and TSV 232. Then, a portion of dielectric liner 230 over back end 236 of TSV 232 can be removed by CMP to reveal back end 236 of TSV 232. Back end 236 of TSV 232 can also be polished when dielectric liner 230 is polished. Then, electrical connectors and/or other packaging (not shown in FIG. 2G) can be formed over back end 236 of TSV 232.

In an alternative implementation, after etching porous silicon region 222 and bulk silicon substrate 220, a dielectric layer (not shown in FIG. 2G) can be formed over porous silicon region 222, bulk silicon substrate 220, and dielectric liner 230. Then, CMP can be utilized to remove dielectric liner 230 from back end 236 of TSV 232, and to concurrently planarize the dielectric layer (not shown in FIG. 2G) with back end 236 of TSV 232. In another implementation, after etching porous silicon region 222 and bulk silicon substrate 220, a portion of dielectric liner 230 over back end 236 of TSV 232 can be removed by a fluorine-based wet etch. In yet another implementation, back end 236 of TSV 232 can be exposed by using a single CMP action to remove dielectric liner 230 from back end 236 of TSV 232, and to concurrently remove portions of porous silicon region 222, bulk silicon substrate 220, and TSV 232.

Notably, porous silicon region 222 and bulk silicon substrate 220 are both etched to reveal back end 236 of TSV 232. As shown in FIG. 2F, prior to revealing back end 236 of TSV 232, the depth of porous silicon region 222 in bulk silicon substrate 220 was greater than or equal to the depth of TSV 232 in bulk silicon substrate 220. As a result, after revealing back end 236 of TSV 232 as shown in FIG. 2G, porous silicon region 222 extends substantially to backside 244 of bulk silicon substrate 220. Accordingly, porous silicon region 222 greatly improves the ability of semiconductor structure 212 and/or TSV 232 to withstand thermal and mechanical stresses.

Figure 3:
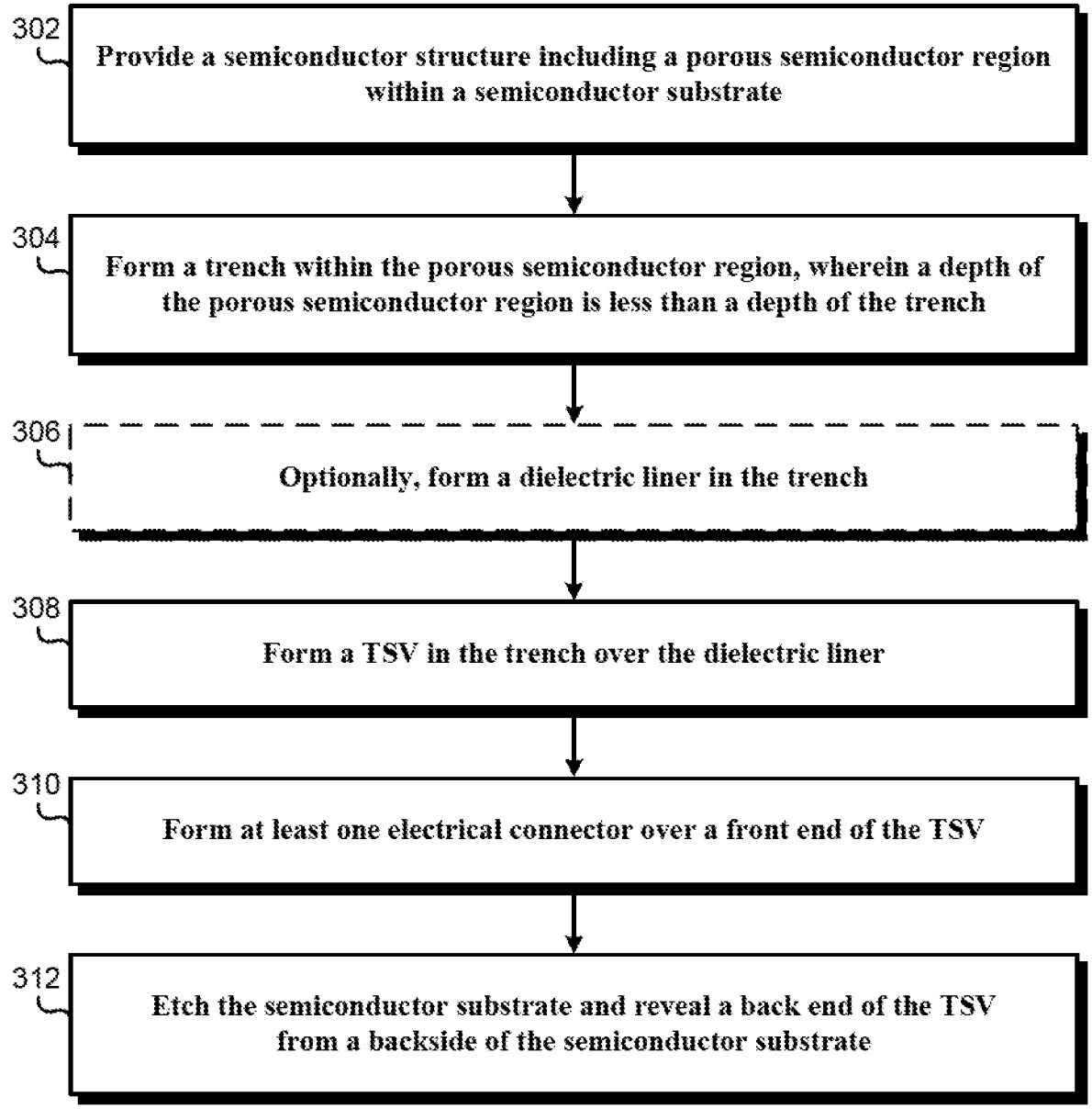
FIG. 3 illustrates a flowchart of an exemplary method for manufacturing a semiconductor structure according to one implementation of the present application.
Figure 4A:
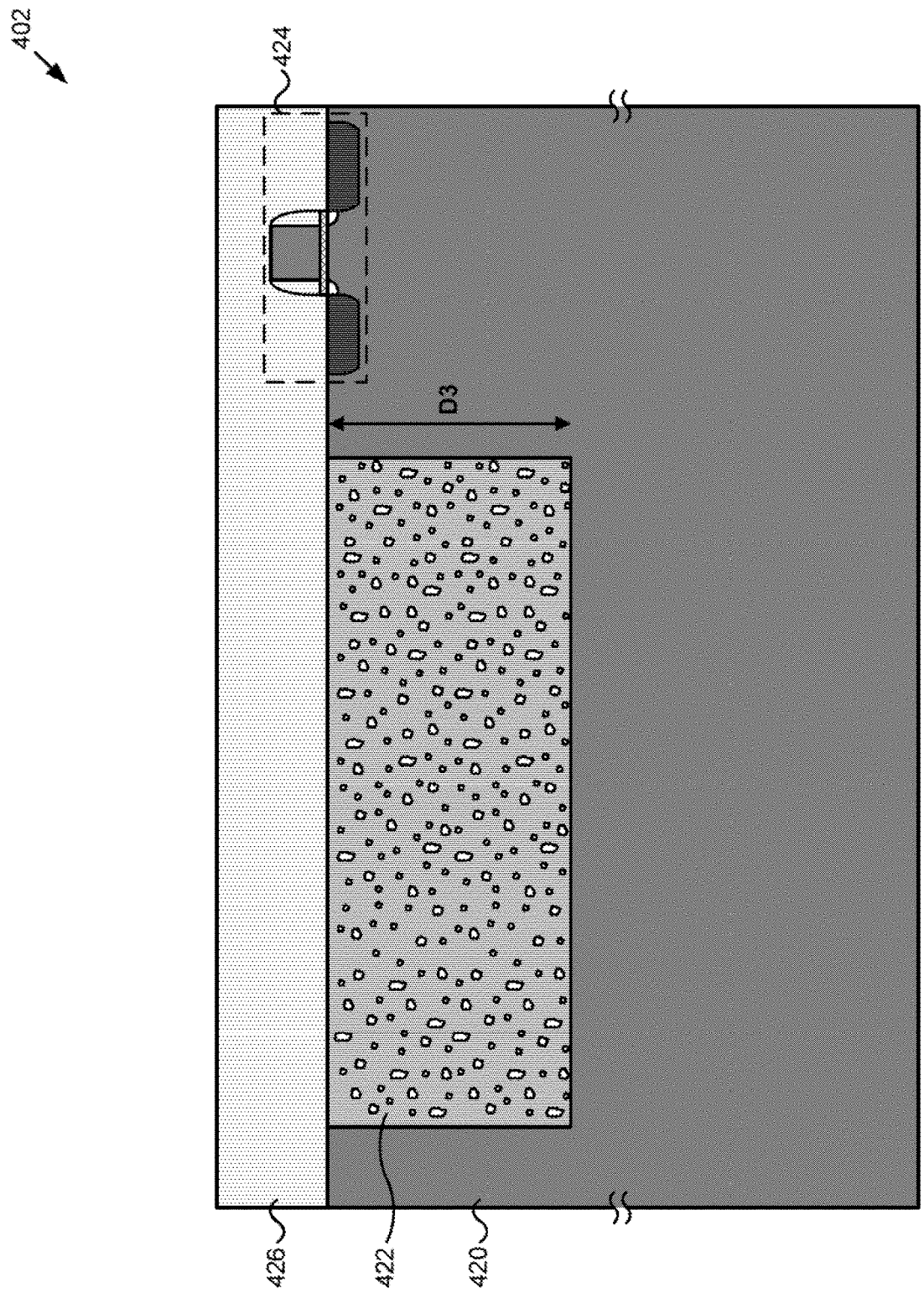
FIG. 4A illustrates a cross-sectional view of a portion of a semiconductor structure processed in accordance with the flowchart of FIG. 3 according to one implementation of the present application.
Figure 4B:
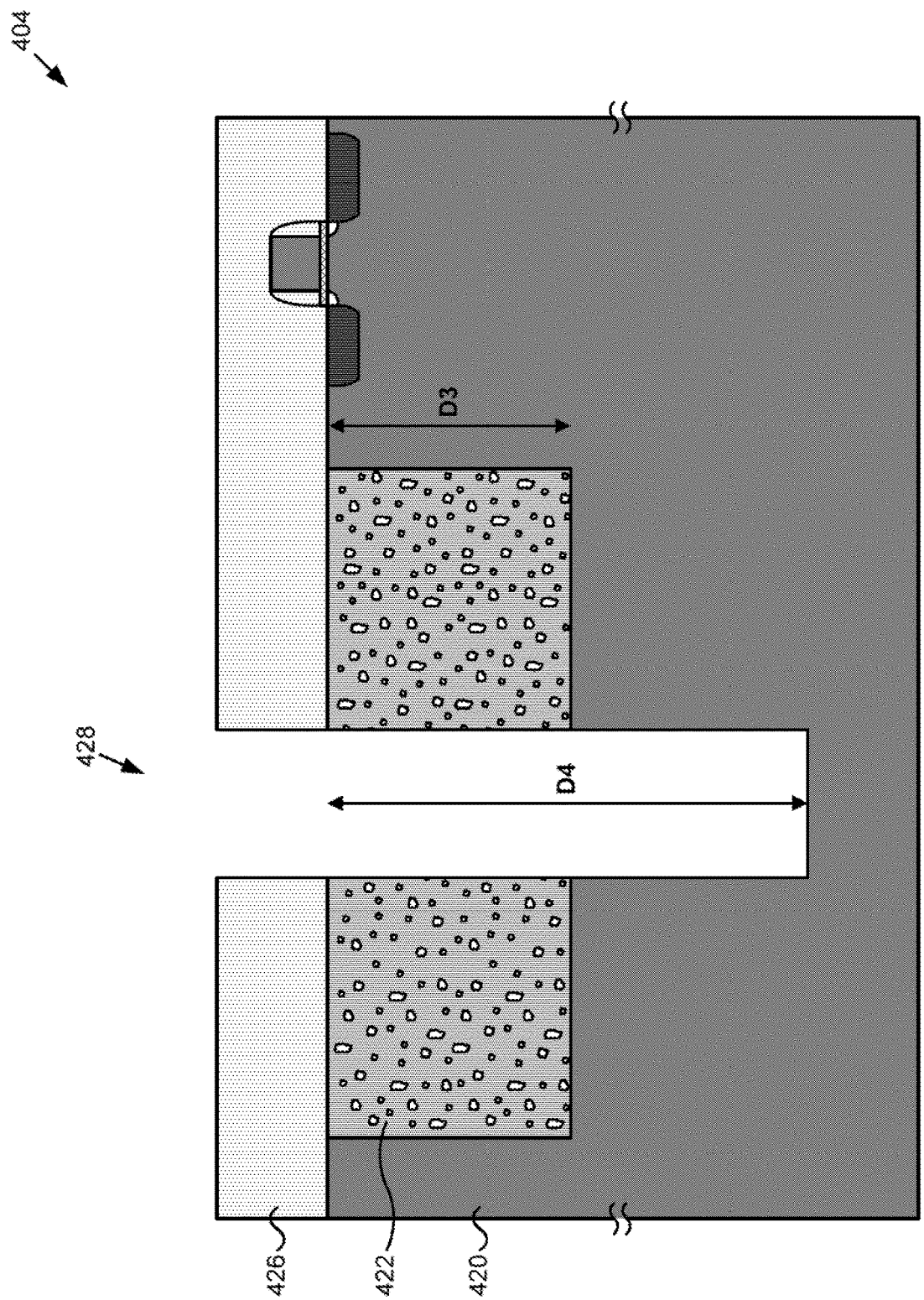
FIG. 4B illustrates a cross-sectional view of a portion of a semiconductor structure processed in accordance with the flowchart of FIG. 3 according to one implementation of the present application.

FIG. 3 illustrates a flowchart of an exemplary method for manufacturing a semiconductor structure according to one implementation of the present application. Structures shown in FIGS. 4A through 4F illustrate the results of performing actions 302 through 312 shown in the flowchart of FIG. 3. For example, FIG. 4A shows a semiconductor structure after performing action 302 in FIG. 3, FIG. 4B shows a semiconductor structure after performing action 304 in FIG. 3, and so forth.

Actions 302 through 312 shown in the flowchart of FIG. 3 are sufficient to describe one implementation of the present inventive concepts. Other implementations of the present inventive concepts may utilize actions different from those shown in the flowchart of FIG. 3. Certain details and features have been left out of the flowchart of FIG. 3 that are apparent to a person of ordinary skill in the art. For example, an action may consist of one or more sub-actions or may involve specialized equipment or materials, as known in the art. Moreover, some actions, such as masking and cleaning actions, may be omitted so as not to distract from the illustrated actions.

Unlike in action 104 in the flowchart of FIG. 1, wherein a depth of the porous semiconductor region is greater than or equal to a depth of the trench, in action 304 in the flowchart of FIG. 3, a depth of the porous semiconductor region is less than a depth of the trench. Also, unlike in action 112 in the flowchart of FIG. 1, wherein the porous semiconductor region is etched to reveal a back end of the TSV, in action 312 in the flowchart of FIG. 3, only the semiconductor substrate is etched to reveal a back end of the TSV. Except for differences described above, the flowchart of FIG. 3 generally corresponds to the flowchart of FIG. 1, and may have any implementations and advantages described above.

FIG. 4A illustrates a cross-sectional view of a portion of a semiconductor structure processed in accordance with action 302 in the flowchart of FIG. 3 according to one implementation of the present application. As shown in FIG. 4A, semiconductor structure 402 is provided. Semiconductor structure 402 includes bulk silicon substrate 420, porous silicon region 422, semiconductor device 424, and interlayer dielectric 426.

Depth D3 represents the depth of porous silicon region 422 measured from the top surface of bulk silicon substrate 420. In various implementations, depth D3 of porous silicon region 422 can be approximately fifty microns (50 µm). In various implementations, porous silicon region 422 can have any other depth. Notably, depth D3 of porous silicon region 422 in FIG. 4A is less than depth D1 of porous silicon region 222 in FIG. 2A. Except for differences described above, semiconductor structure 402 in FIG. 4A generally corresponds to semiconductor structure 202 in FIG. 2A, and may have any implementations and advantages described above.

FIG. 4B illustrates a cross-sectional view of a portion of a semiconductor structure processed in accordance with action 304 in the flowchart of FIG. 3 according to one implementation of the present application. As shown in FIG. 4B, in semiconductor structure 404, trench 428 is formed in porous silicon region 422. Trench 428 extends through interlayer dielectric 426, through porous silicon region 422, and into bulk silicon substrate 420.

Depth D4 represents the depth of trench 428 measured fro the top surface of bulk silicon substrate 420. In the present implementation, depth D3 of porous silicon region 422 is substantially less than depth D4 of trench 428. The timing of an etching action utilized to form trench 428 can be lengthened to ensure that depth D3 of porous silicon region 422 is less than depth D4 of trench 428. In various implementations, depth D4 of trench 428 can range from approximately fifty microns to approximately two hundred fifty microns (50 µm-250 µm). In one implementation, depth D3 of porous silicon region 422 is approximately ten microns (10 µm) less than depth D4 of trench 428 to ensure that porous silicon region 422 is not damaged in a subsequent reveal action. For example, depth D3 of porous silicon region 422 can be approximately ninety microns (90 µm), while depth D4 of trench 428 can be approximately one hundred microns (100 µm). Except for differences described above, semiconductor structure 404 in FIG. 4B generally corresponds to semiconductor structure 204 in FIG. 2B, and may have any implementations and advantages described above.

Figure 4C:
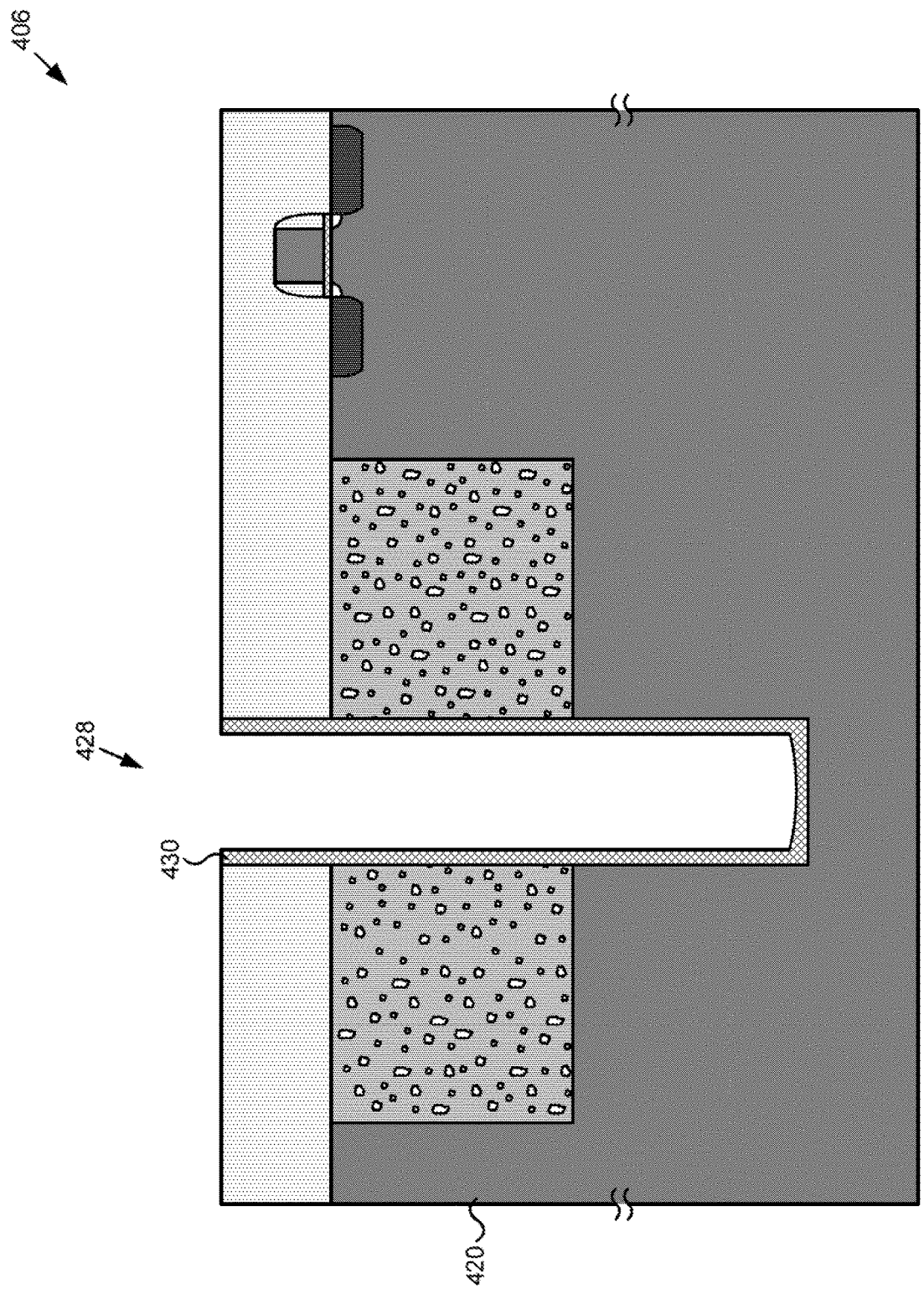
FIG. 4C illustrates a cross-sectional view of a portion of a semiconductor structure processed in accordance with the flowchart of FIG. 3 according to one implementation of the present application.

FIG. 4C illustrates a cross-sectional view of a portion of a semiconductor structure processed in accordance with action 306 in the flowchart of FIG. 3 according to one implementation of the present application. As shown in FIG. 4C, in semiconductor structure 406, dielectric liner 430 is formed in trench 428.

Unlike in FIG. 2C, wherein dielectric liner 230 is formed over porous silicon region 222 and interlayer dielectric 226 along sidewalls of trench 228, dielectric liner 430 in FIG. 4C is additionally formed over bulk silicon substrate 420 on sidewalls of trench 428. Except for differences described above, semiconductor structure 406 in FIG. 4C generally corresponds to semiconductor structure 206 in FIG. 2C, and may have any implementations and advantages described above.

Figure 4D:
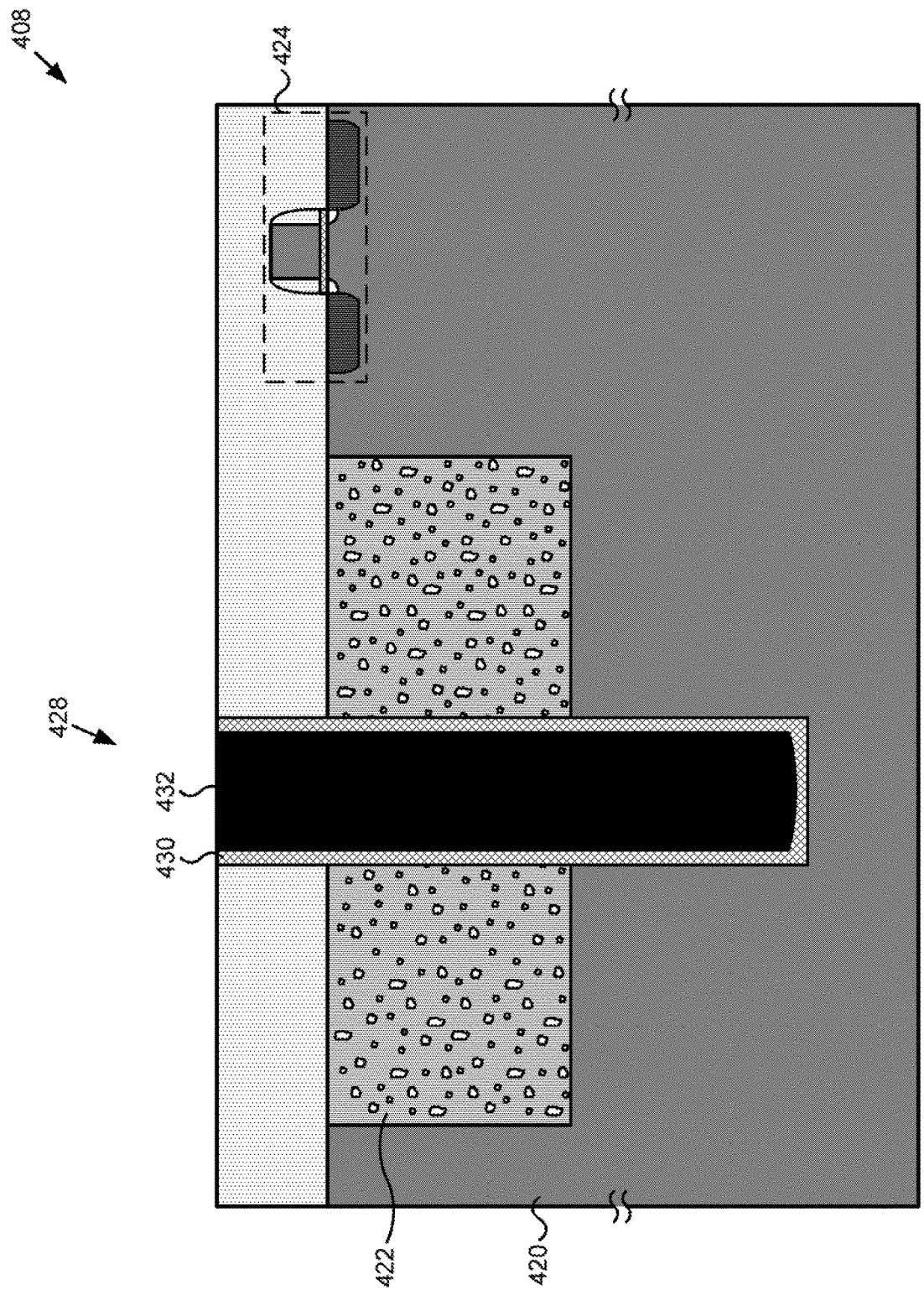
FIG. 4D illustrates a cross-sectional view of a portion of a semiconductor structure processed in accordance with the flowchart of FIG. 3 according to one implementation of the present application.

FIG. 4D illustrates a cross-sectional view of a portion of a semiconductor structure processed in accordance with action 308 in the flowchart of FIG. 3 according to one implementation of the present application. As shown in FIG. 4D, in semiconductor structure 408, TSV 432 is formed in trench 428 over dielectric liner 430.

Unlike in FIG. 2D, wherein a depth of porous silicon region 222 is greater than or equal to a depth of TSV 232, in FIG. 4C, a depth of porous silicon region 422 is less than a depth of TSV 432. Accordingly, TSV 432 in FIG. 4D is additionally situated within bulk silicon substrate 420. Except for differences described above, semiconductor structure 408 in FIG. 4D generally corresponds to semiconductor structure 208 in FIG. 2D, and may have any implementations and advantages described above.

Figure 4E:
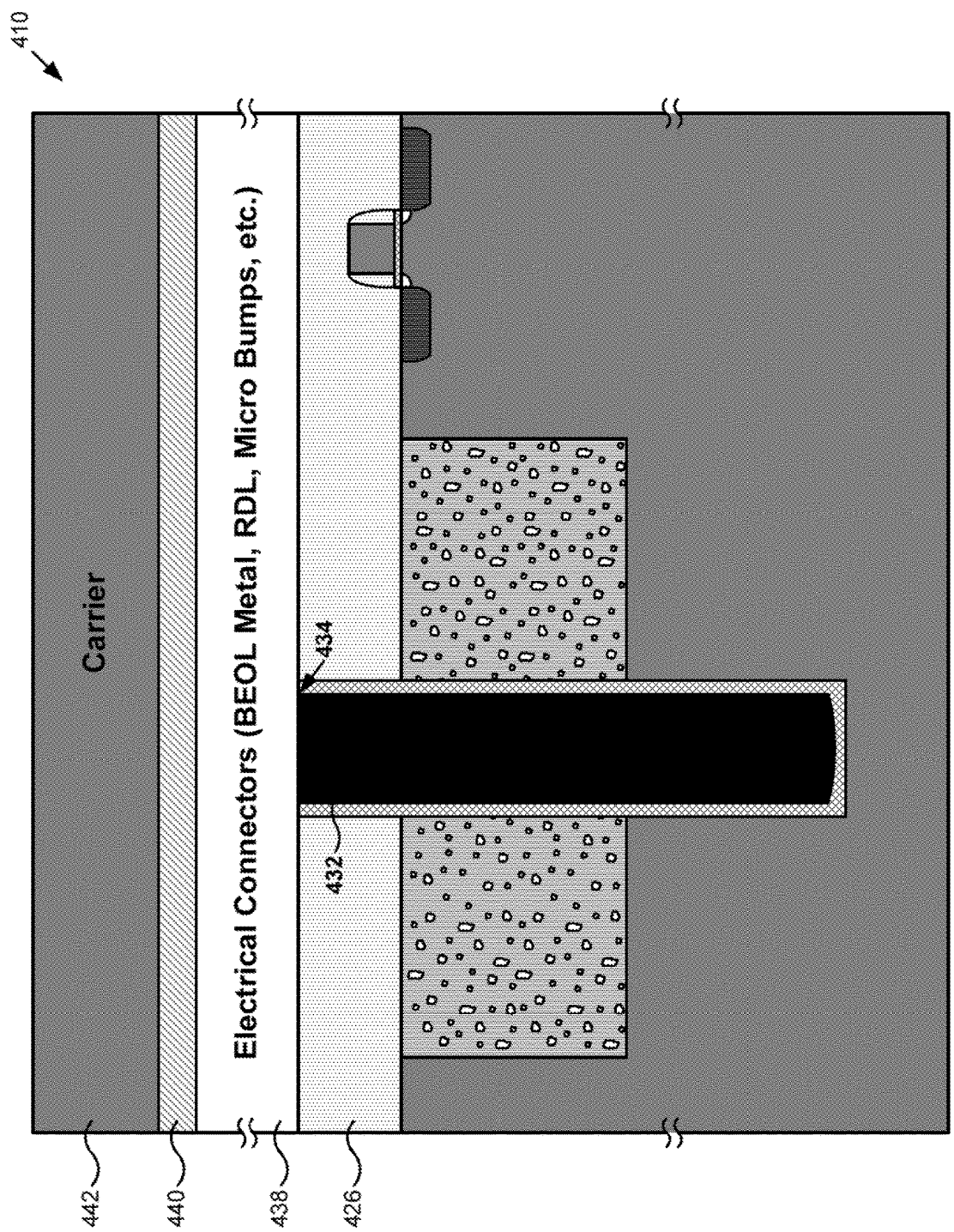
FIG. 4E illustrates a cross-sectional view of a portion of a semiconductor structure processed in accordance with the flowchart of FIG. 3 according to one implementation of the present application.

FIG. 4E illustrates a cross-sectional view of a portion of a semiconductor structure processed in accordance with action 310 the flowchart of FIG. 3 according to one implementation of the present application. As shown in FIG. 4E, in semiconductor structure 410, electrical connection layer 438 is formed over TSV 432 and over interlayer dielectric 426. Electrical connection layer 438 contains at least one electrical connector situated over front end 434 of TSV 432. Also, electrical connection layer 438 is temporarily bonded with carrier wafer 442 by bonding layer 440. Semiconductor structure 410 in FIG. 4E generally corresponds to semiconductor structure 210 in FIG. 2F, and may have any implementations and advantages described above.

Figure 4F:
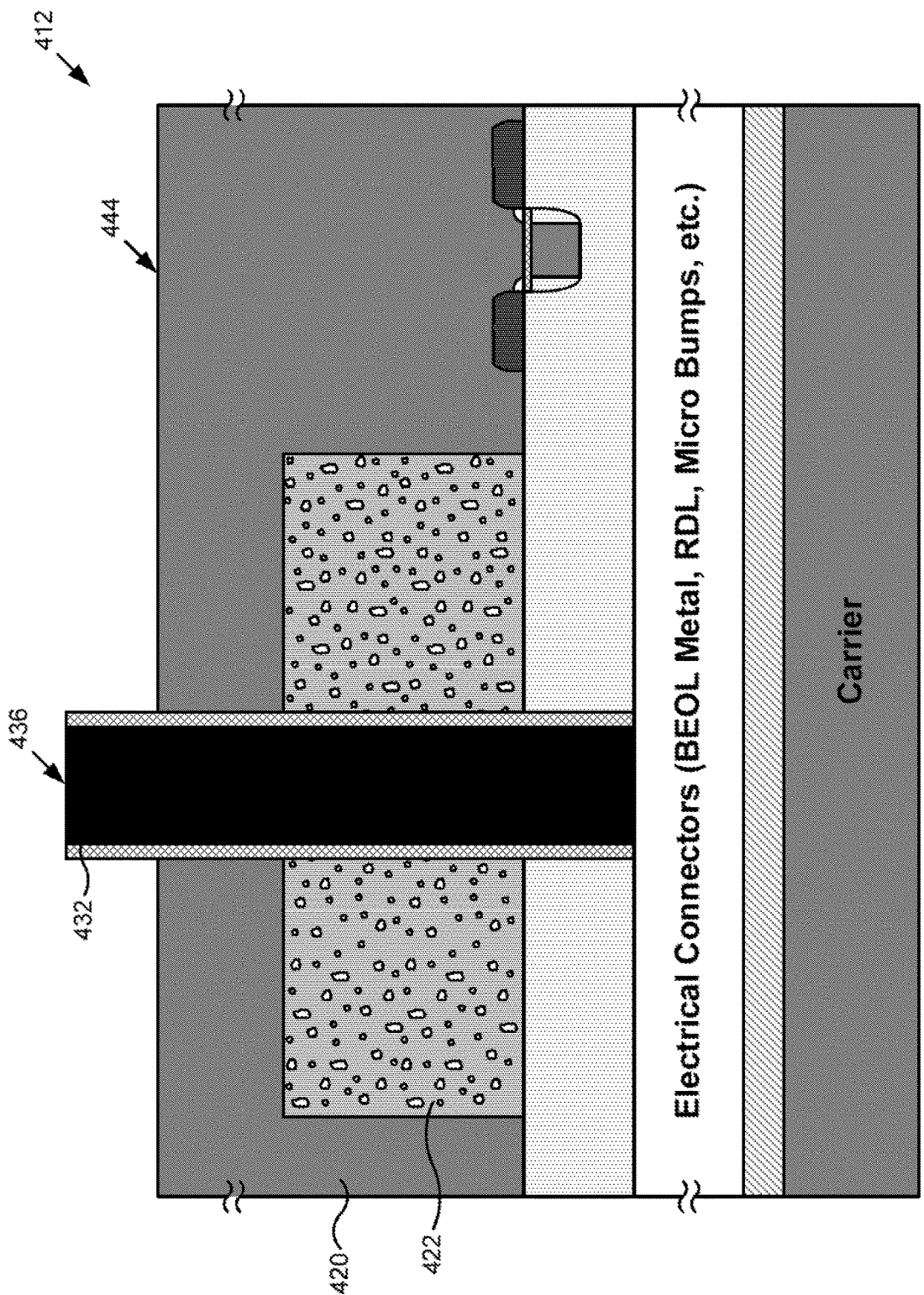
FIG. 4F illustrates a cross-sectional view of a portion of a semiconductor structure processed in accordance with the flowchart of FIG. 3 according to one implementation of the present application.

FIG. 4F illustrates a cross-sectional view of a portion of a semiconductor structure processed in accordance with action 312 the flowchart of FIG. 3 according to one implementation of the present application. As shown in FIG. 4F, in semiconductor structure 412, bulk silicon substrate 420 is etched, and back end 436 of TSV 432 is revealed from backside 444 of bulk silicon substrate 420.

Unlike in FIG. 2G, wherein porous silicon region 222 and bulk silicon substrate 220 are both etched, in FIG. 4F, only bulk silicon substrate 420 is etched. When revealing back end 236 of TSV 232 as shown in FIG. 2G, pores of porous silicon region 222 can absorb solutions utilized in the etching action. These solutions cannot be easily removed from porous silicon region 222, and can damage porous silicon region 222 and/or reduce the ability of porous silicon region 222 to withstand thermal and mechanical stresses.

As shown in FIG. 4E, prior to revealing back end 436 of TSV 432, the depth of porous silicon region 422 in bulk silicon substrate 420 was less than the depth of TSV 432 in bulk silicon substrate 420. In one implementation, the depth of porous silicon region 422 relative to TSV 432 is determined based on a process parameter of the reveal action. For example, where the reveal action is only accurate to five microns (5 μm), the depth of porous silicon region 422 can be approximately ten microns (10 μm) less than the depth of TSV 432 to ensure that porous silicon region 422 is not damaged in the reveal action. For example, the depth of porous silicon region 422 can be approximately ninety microns (90 μm), while the depth of TSV 432 can be approximately one hundred microns (100 μm).

As a result, after revealing back end 436 of TSV 432 as shown in FIG. 4F, porous silicon region 422 remains substantially unetched. A portion of bulk silicon substrate 420 intervenes between porous silicon region 422 and backside 444, and is situated against the sides of TSV 432 (or against the sides of dielectric liner 430 in case dielectric liner 430 is used). Porous silicon region 422 still improves the ability of semiconductor structure 412 and/or TSV 432 to withstand thermal and mechanical stresses. Moreover, porous silicon region 422 does not absorb any etching solutions and provides increased reliability. It is noted that porous silicon region 422 and TSV 432 in FIGS. 4E and 4F are not drawn to scale, and may be exaggerated for purposes of illustration. Except for differences described above, semiconductor structure 412 in FIG. 4F generally corresponds to semiconductor structure 212 in FIG. 2G, and may have any implementations and advantages described above.

Figure 5:
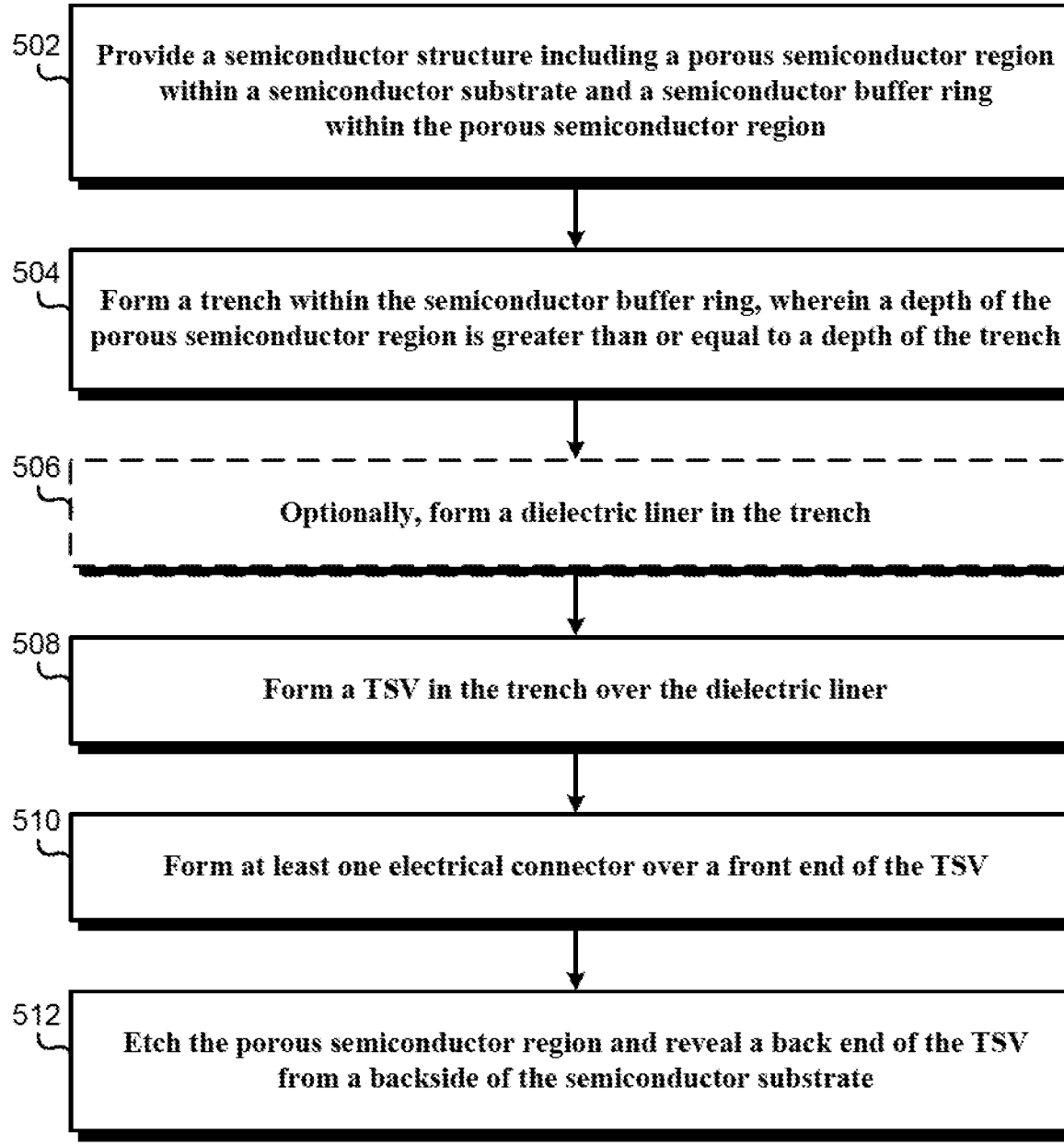
FIG. 5 illustrates a flowchart of an exemplary method for manufacturing a semiconductor structure according to one implementation of the present application.
Figure 6A:
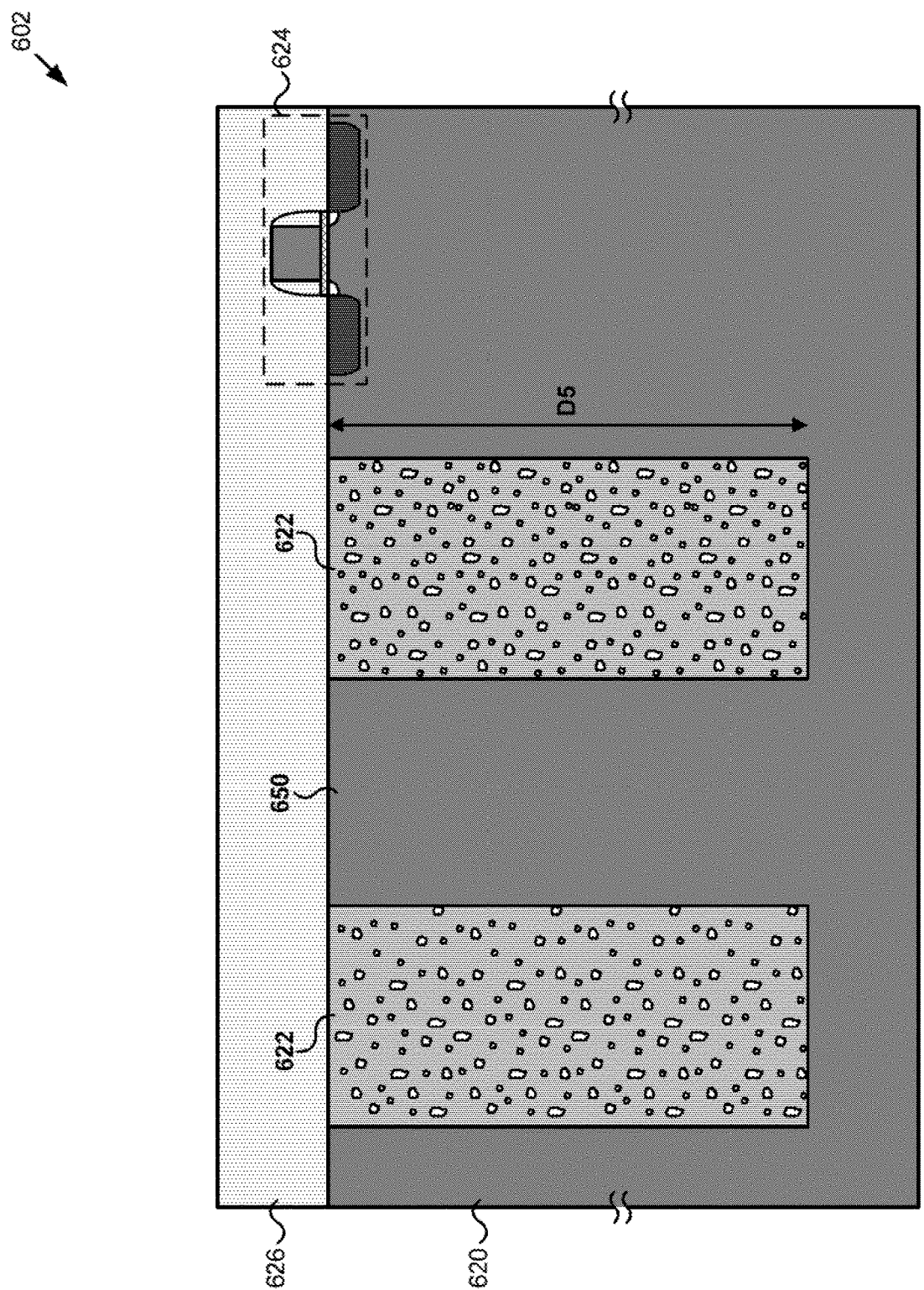
FIG. 6A illustrates a cross-sectional view of a portion of a semiconductor structure processed in accordance with the flowchart of FIG. 5 according to one implementation of the present application.
Figure 6B:
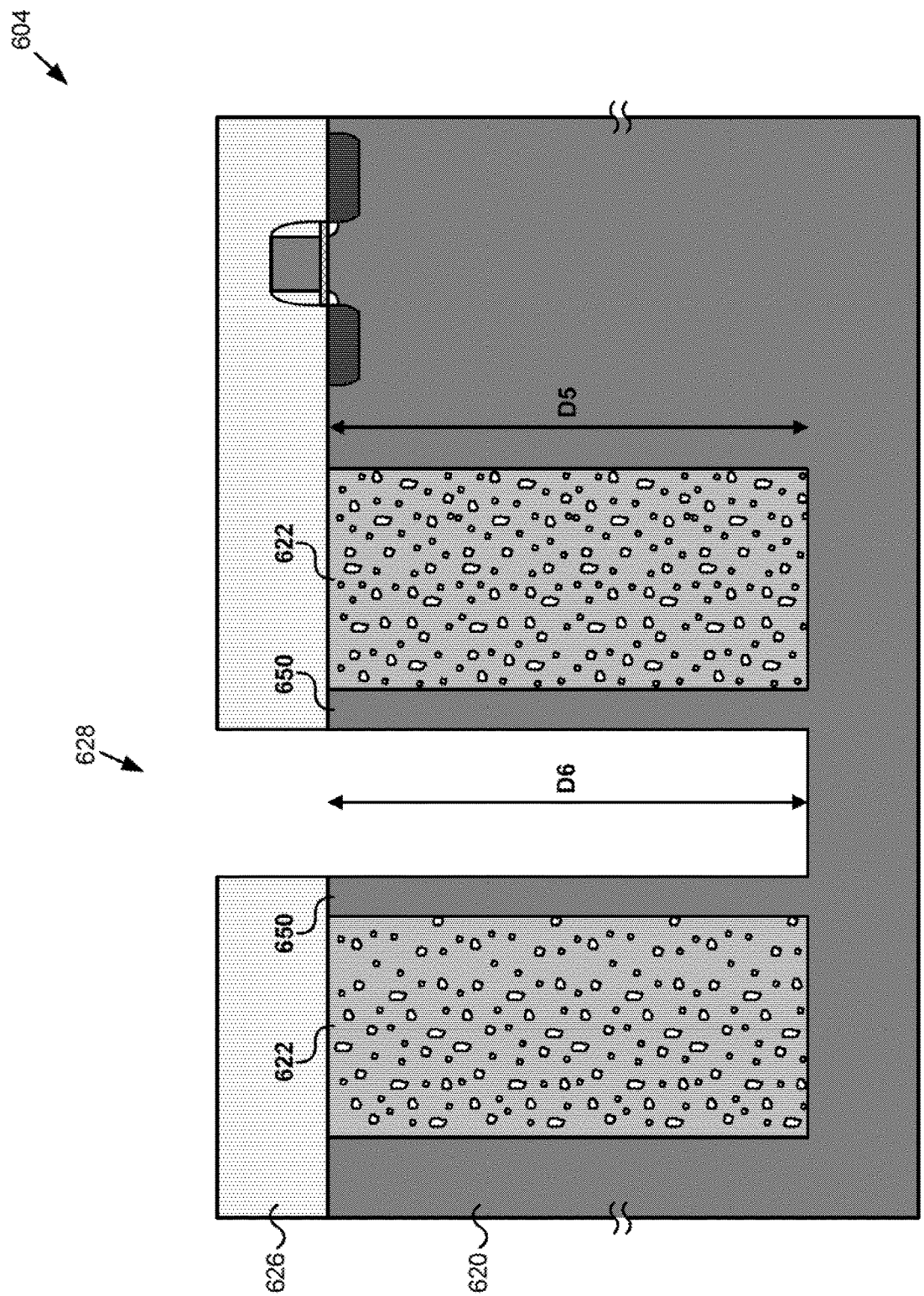
FIG. 6B illustrates a cross-sectional view of a portion of a semiconductor structure processed in accordance with the flowchart of FIG. 5 according to one implementation of the present application.

FIG. 5 illustrates a flowchart of an exemplary method for manufacturing a semiconductor structure according to one implementation of the present application. Structures shown in FIGS. 6A through 6G illustrate the results of performing actions 502 through 512 shown in the flowchart of FIG. 5. For example, FIG. 6A shows a semiconductor structure after performing action 502 in FIG. 5, FIG. 6B shows a semiconductor structure after performing action 504 in FIG. 5, and so forth.

Actions 502 through 512 shown in the flowchart of FIG. 5 are sufficient to describe one implementation of the present inventive concepts. Other implementations of the present inventive concepts may utilize actions different from those shown in the flowchart of FIG. 5. Certain details and features have been left out of the flowchart of FIG. 5 that are apparent to a person of ordinary skill in the art. For example, an action may consist of one or more sub-actions or may involve specialized equipment or materials, as known in the art. Moreover, some actions, such as masking and cleaning actions, may be omitted so as not to distract from the illustrated actions.

Unlike in action 102 in the flowchart of FIG. 1, wherein a semiconductor structure includes a porous semiconductor region within a semiconductor substrate, in action 502 in the flowchart of FIG. 5, a semiconductor structure additionally includes a semiconductor buffer ring within the porous semiconductor region. Also, unlike in action 104 in the flowchart of FIG. 1, wherein a trench is formed in the porous semiconductor region, in action 504 in the flowchart of FIG. 5, a trench is formed in the semiconductor buffer ring. Except for differences described above, the flowchart of FIG. 5 generally corresponds to the flowchart of FIG. 1, and may have any implementations and advantages described above.

FIG. 6A illustrates a cross-sectional view of a portion of a semiconductor structure processed in accordance with action 502 in the flowchart of FIG. 5 according to one implementation of the present application. As shown in FIG. 6A, semiconductor structure 602 is provided. Semiconductor structure 602 includes bulk silicon substrate 620, porous silicon regions 622, semiconductor device 624, interlayer dielectric 626, and silicon buffer ring 650.

Silicon buffer ring 650 is situated within porous silicon regions 622. In one implementation, a hardmask is formed over bulk silicon substrate 620 to expose segments thereof. Then, porous silicon regions 622 is formed by electrochemical etching the exposed segments of bulk silicon substrate 620 using hydrofluoric acid (HF). Unlike the hardmask utilized to form porous silicon region 222 in FIG. 2A, the hardmask utilized to form porous silicon regions 622 in FIG. 6A can cover an additional segment of bulk silicon substrate 620, such that silicon buffer ring 650 remains after porous silicon regions 622 are formed. In various implementations, silicon buffer ring 650 may be a semiconductor material other than silicon.

Depth D5 represents the depth of porous silicon region 622 measured from the top surface of bulk silicon substrate 620. In various implementations, depth D5 of porous silicon regions 622 can be approximately two hundred fifty microns (250 μm). In various implementations, porous silicon regions 622 can have any other depth. Notably, although porous silicon regions 622 are illustrated as distinct regions in the cross-sectional view in FIG. 6A, in various implementations, porous silicon regions 622 can be integrally formed as a single porous silicon region, connected in a plane not illustrated in FIG. 6A. Except for differences described above, semiconductor structure 602 in FIG. 6A generally corresponds to semiconductor structure 202 in FIG. 2A, and may have any implementations and advantages described above.

FIG. 6B illustrates a cross-sectional view of a portion of a semiconductor structure processed in accordance with action 504 in the flowchart of FIG. 5 according to one implementation of the present application. As shown in FIG. 6B, in semiconductor structure 604, trench 628 is formed in silicon buffer ring 650.

Trench 628 extends through interlayer dielectric 626 and into silicon buffer ring 650. In various implementations, a width of silicon buffer ring 650 between trench 628 and an adjacent one of porous silicon regions 622 can range from approximately two microns to approximately ten microns (2 µm-10 µm). Depth D6 represents the depth of trench 628 measured from the top surface of bulk silicon substrate 620 that may or may not be as great as depth D5 of porous silicon region 622. In the present implementation, depth D5 of porous silicon regions 622 is substantially equal to depth D6 of trench 628. Alternatively, depth D5 of porous silicon regions 622 can be greater than depth D6 of trench 628. The timing of an etching action utilized to form trench 628 can be shortened to ensure that depth D5 of porous silicon regions 622 is greater than depth D6 of trench 628. In various implementations, depth D6 of trench 628 can range from approximately fifty microns to approximately two hundred fifty microns (50 µm-250 µm). Except for differences described above, semiconductor structure 604 in FIG. 6B generally corresponds to semiconductor structure 204 in FIG. 2B, and may have any implementations and advantages described above.

Figure 6C:
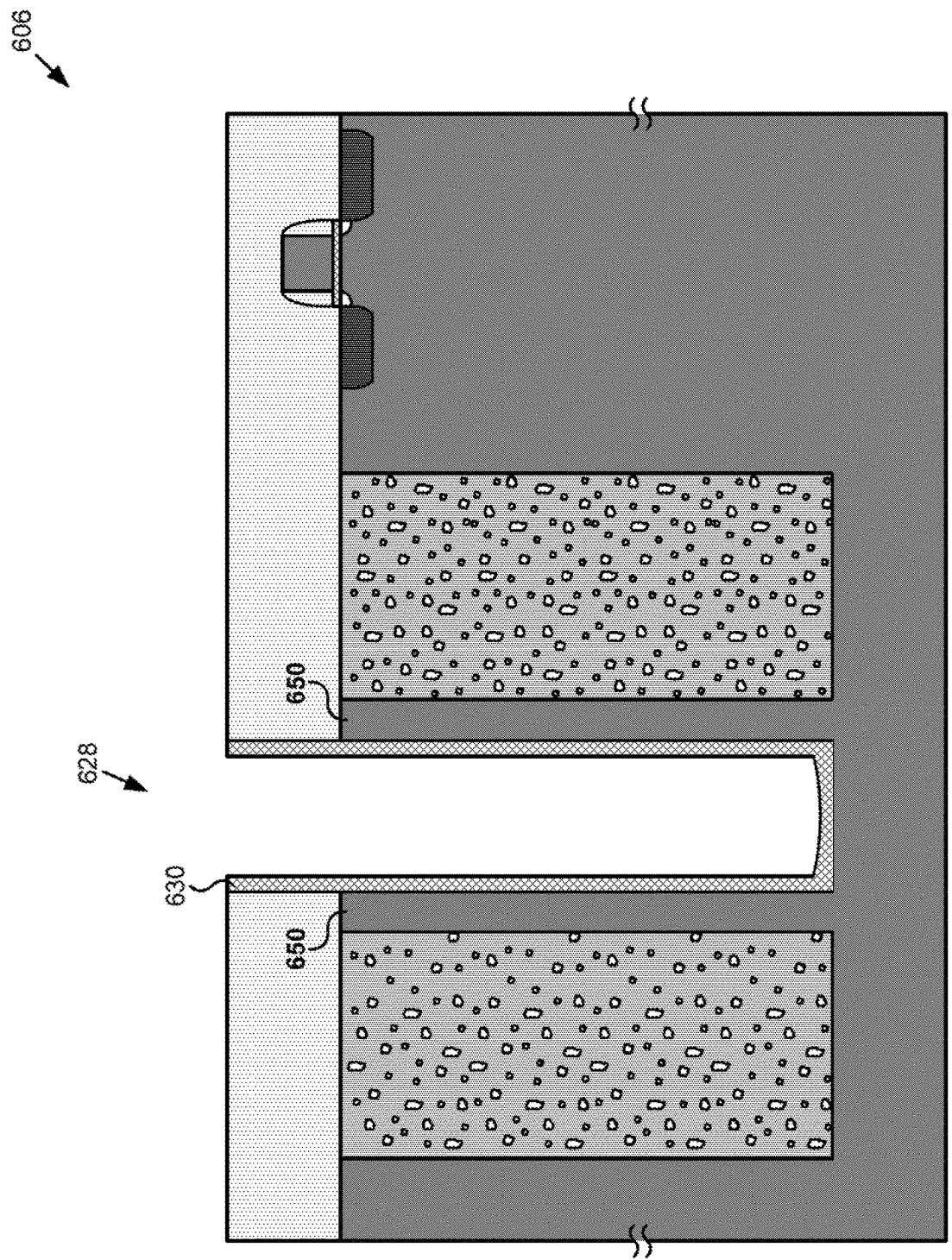
FIG. 6C illustrates a cross-sectional view of a portion of a semiconductor structure processed in accordance with the flowchart of FIG. 5 according to one implementation of the present application.

FIG. 6C illustrates a cross-sectional view of a portion of a semiconductor structure processed in accordance with action 506 in the flowchart of FIG. 5 according to one implementation of the present application. As shown in FIG. 6C, in semiconductor structure 606, dielectric liner 630 is formed in trench 628.

Unlike in FIG. 2C, wherein dielectric liner 230 is formed over porous silicon region 222 along sidewalls of trench 228, dielectric liner 630 in FIG. 6C is formed over silicon buffer ring 650 on sidewalls of trench 628. Because silicon buffer ring 650 is a homogeneous single crystal surface, dielectric liner 630 can be deposited substantially conformably in trench 628. If silicon buffer ring 650 were not used, and a dielectric liner were instead deposited in a trench having porous sidewalls as shown in FIG. 2C, nonconformities can occur in the deposited dielectric liner, especially where the sidewalls are highly porous. Except for differences described above, semiconductor structure 606 in FIG. 6C generally corresponds to semiconductor structure 206 in FIG. 2C, and may have any implementations and advantages described above.

Figure 6D:
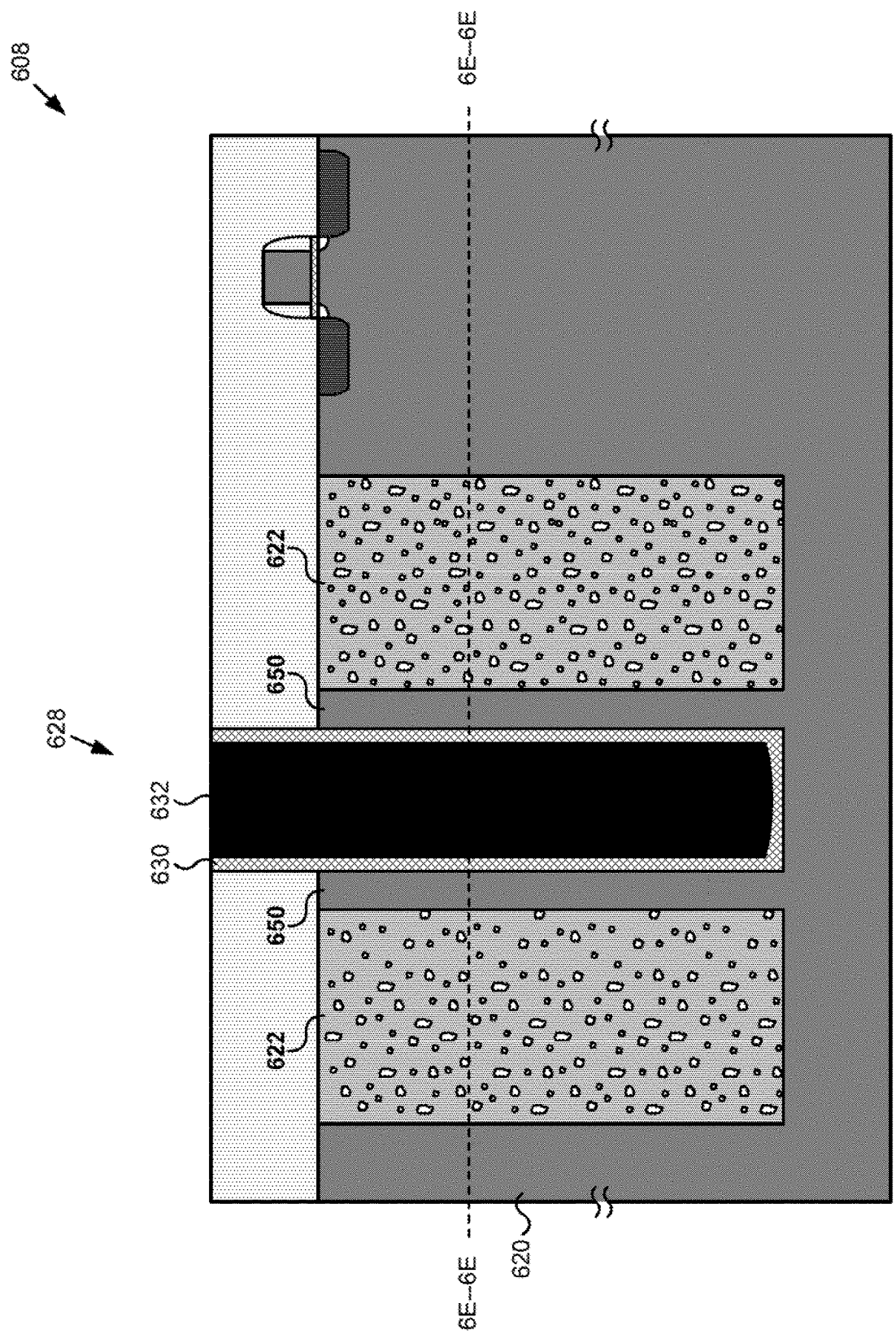
FIG. 6D illustrates a cross-sectional view of a portion of a semiconductor structure processed in accordance with the flowchart of FIG. 5 according to one implementation of the present application.

FIG. 6D illustrates a cross-sectional view of a portion of a semiconductor structure processed in accordance with action 508 in the flowchart of FIG. 5 according to one implementation of the present application. As shown in FIG. 6D, in semiconductor structure 608, TSV 632 is formed in trench 628 over dielectric liner 630.

As described above, porous silicon regions 622 provide better effective CTE matching with TSV 632 compared to bulk silicon substrate 620, and porous silicon regions 622 are more deformable compared to bulk silicon substrate 620. Where a width of silicon buffer ring 650 between TSV 632 and one of porous silicon regions 622 is kept small, porous silicon regions 622 and silicon buffer ring 650 cause semiconductor structure 608 and/or TSV 632 to withstand thermal and mechanical stresses. At the same time, because TSV 632 in FIG. 6D (or dielectric liner 630 in case dielectric liner 630 is used) interfaces with silicon buffer ring 650, rather than interfacing with a porous silicon region as shown in FIG. 2D, metal of TSV 632 is less likely to diffuse.

Further, because silicon buffer ring 650 is a homogeneous single crystal surface, TSV 632 can be formed substantially uniformly in trench 628. If silicon buffer ring 650 were not used, and a TSV were instead formed in a trench having porous sidewalls as shown in FIG. 2D, nonconformities can occur in the TSV, especially where the sidewalls are highly porous. Except for differences described above, semiconductor structure 608 in FIG. 6D generally corresponds to semiconductor structure 208 in FIG. 2D, and may have any implementations and advantages described above.

Figure 6E:
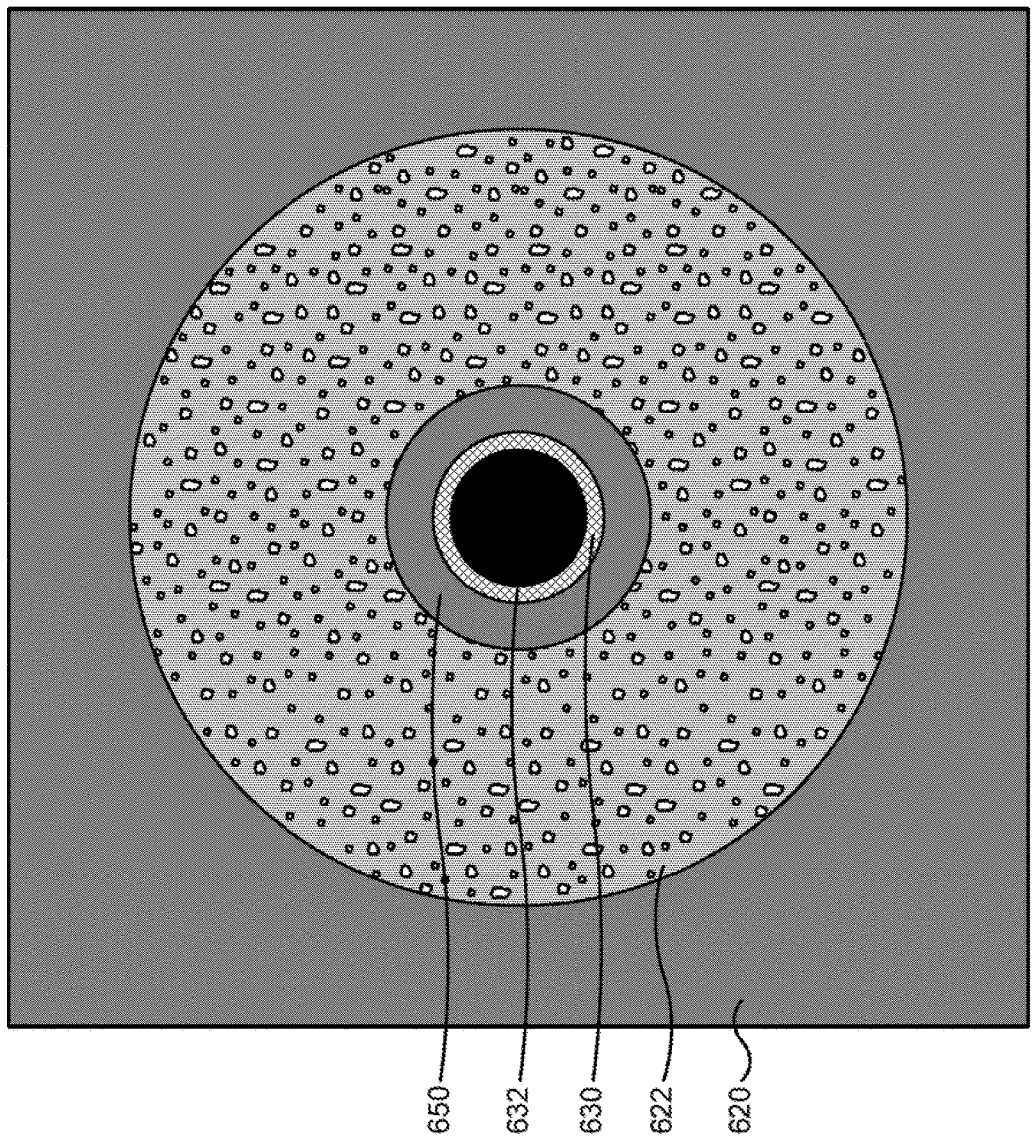
FIG. 6E illustrates a top cross-sectional view of a portion of a semiconductor structure corresponding to the semiconductor structure in FIG. 6D according to one implementation of the present application.

FIG. 6E illustrates a top cross-sectional view of a portion of a semiconductor structure corresponding to the semiconductor structure in FIG. 6D according to one implementation of the present application. FIG. 6E represents a cross-sectional view along line "6E-6E" in FIG. 6D.

As shown in FIG. 6E, semiconductor structure 608 includes bulk silicon substrate 620, porous silicon region 622, silicon buffer ring 650, dielectric liner 630, and TSV 632. Porous silicon region 622 is situated within bulk silicon substrate 620, silicon buffer ring 650 is situated within porous silicon region 622, and TSV 632 is situated within silicon buffer ring 650. As described above, porous silicon region 622 and silicon buffer ring 650 cause semiconductor structure 608 and/or TSV 632 to withstand thermal and mechanical stresses. As also described above, silicon buffer ring 650 reduces metal diffusion of TSV 632. Further, because silicon buffer ring 650 is homogeneous single crystal silicon, TSV 632 (and dielectric liner 630 in case dielectric liner 630 is used) are substantially uniform within silicon buffer ring 650. As used in the present application, the term "buffer ring" is not intended as a limiting shape. In various implementations, silicon buffer ring 650 can have a rectangular shape, or any other shape.

Figure 6F:
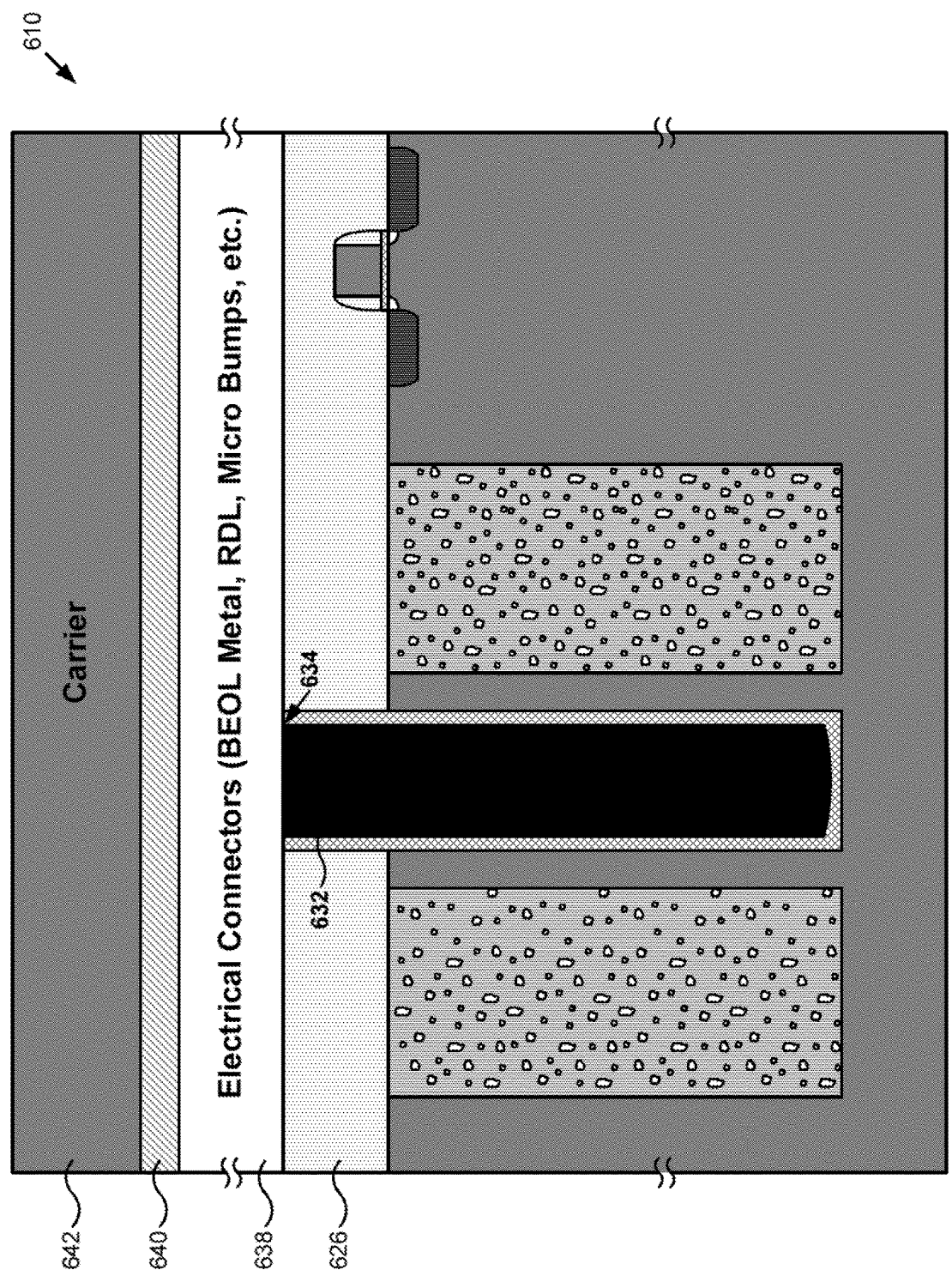
FIG. 6F illustrates a cross-sectional view of a portion of a semiconductor structure processed in accordance with the flowchart of FIG. 5 according to one implementation of the present application.

FIG. 6F illustrates a cross-sectional view of a portion of a semiconductor structure processed in accordance with action 510 in the flowchart of FIG. 5 according to one implementation of the present application. As shown in FIG. 6F, in semiconductor structure 610, electrical connection layer 638 is formed over TSV 632 and over interlayer dielectric 626. Electrical connection layer 638 contains at least one electrical connector situated over front end 634 of TSV 632. Also, electrical connection layer 638 is temporarily bonded with carrier wafer 642 by bonding layer 640. Except for differences described above, semiconductor structure 610 in FIG. 6F generally corresponds to semiconductor structure 210 in FIG. 2F, and may have any implementations and advantages described above.

Figure 6G:
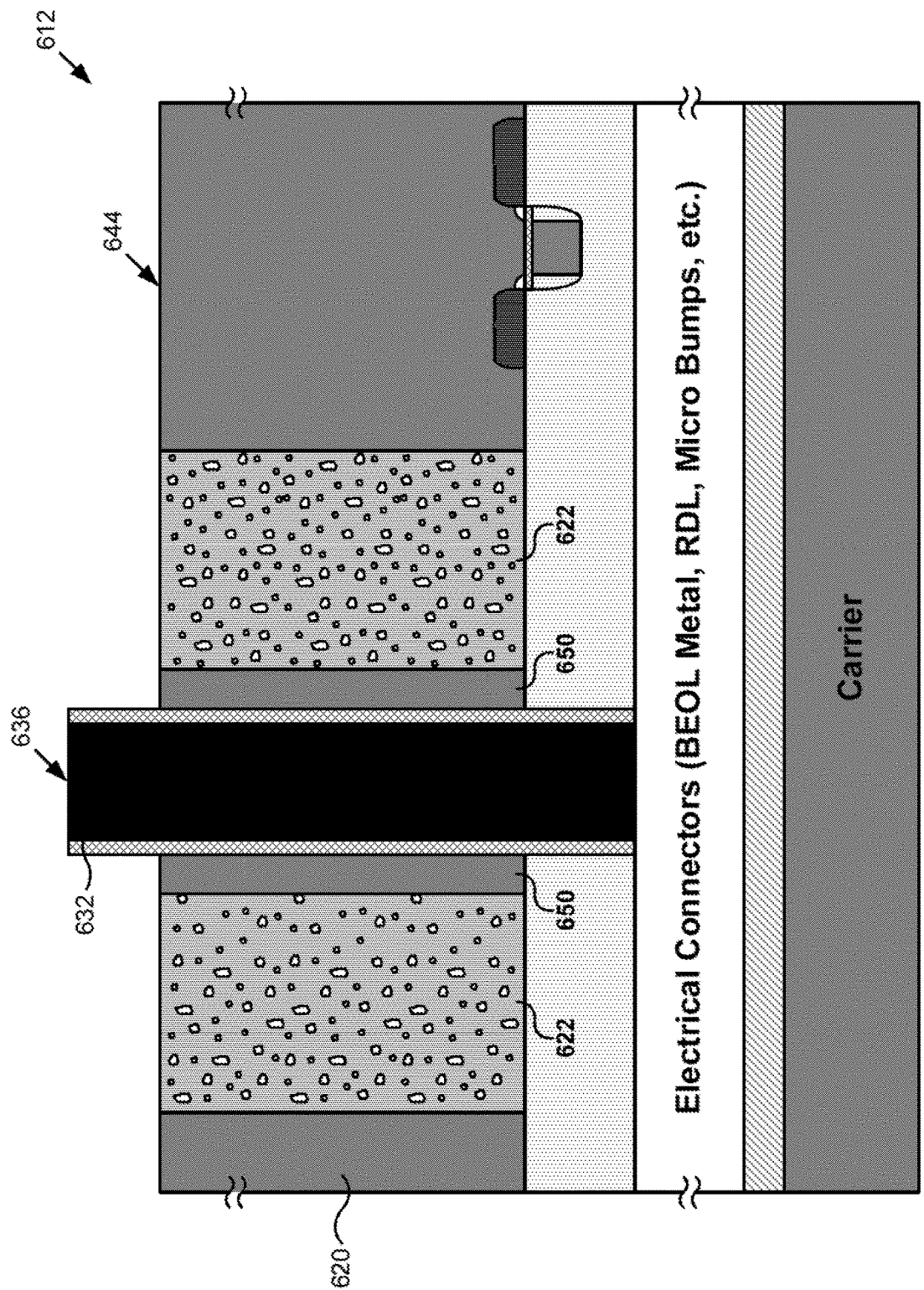
FIG. 6G illustrates a cross-sectional view of a portion of a semiconductor structure processed in accordance with the flowchart of FIG. 5 according to one implementation of the present application.

FIG. 6G illustrates a cross-sectional view of a portion of a semiconductor structure processed in accordance with action 512 the flowchart of FIG. 5 according to one implementation of the present application. As shown in FIG. 6G, in semiconductor structure 612, silicon buffer ring 650, porous silicon regions 622, and bulk silicon substrate 620 are etched, and back end 636 of TSV 632 is revealed from backside 644 of bulk silicon substrate 620.

Notably, porous silicon regions 622 are etched to reveal back end 636 of TSV 632. As a result, porous silicon regions 622 and silicon buffer ring 650 extend substantially to backside 644 of bulk silicon substrate 620. Accordingly, porous silicon regions 622 and silicon buffer ring 650 greatly improve the ability of semiconductor structure 612 and/or TSV 632 to withstand thermal and mechanical stresses. Except for differences described above, semiconductor structure 612 in FIG. 6G generally corresponds to semiconductor structure 212 in FIG. 2G, and may have any implementations and advantages described above.

Figure 7A:
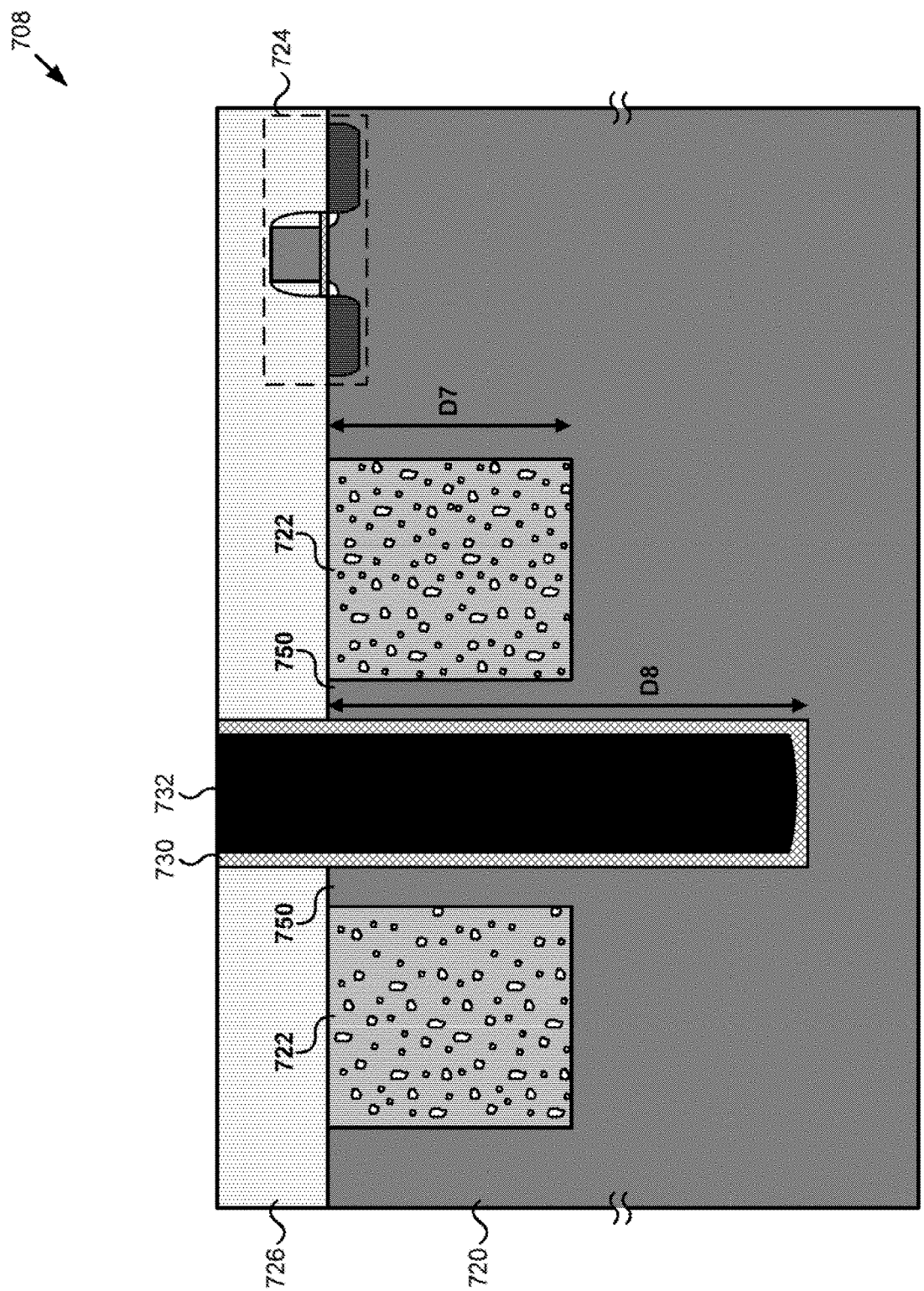
FIG. 7A illustrates a cross-sectional view of a portion of a semiconductor structure according to one implementation of the present application.

FIG. 7A illustrates a cross-sectional view of a portion of a semiconductor structure according to one implementation of the present application. As shown in FIG. 7A, semiconductor structure 708 includes bulk silicon substrate 720, porous silicon regions 722, semiconductor device 724, interlayer dielectric 726, dielectric liner 730, TSV 732, and silicon buffer ring 750. Semiconductor structure 708 represents an implementation employing both a silicon buffer ring and a porous silicon region having a depth less than that of a TSV.

As described above, porous silicon regions 722 and silicon buffer ring 750 cause semiconductor structure 708 and/or TSV 732 to withstand thermal and mechanical stresses. As also described above, silicon buffer ring 750 reduces metal diffusion of TSV 732. Further, because silicon buffer ring 750 is homogeneous single crystal silicon, TSV 732 (and dielectric liner 730 in case dielectric liner 730 is used) are substantially uniform within silicon buffer ring 750.

Depth D7 represents the depth of porous silicon region 722 measured from the top surface of bulk silicon substrate 720. Depth D8 represents the depth of TSV 732 (including dielectric liner 730 in case dielectric liner 730 is used) measured from the top surface of bulk silicon substrate 720. In the present implementation, depth D7 of porous silicon regions 722 is substantially less than depth D8 of TSV 732. Except for differences described above, semiconductor structure 708 in FIG. 7A generally corresponds to semiconductor structure 608 in FIG. 6D, and may have any implementations and advantages described above.

Figure 7B:
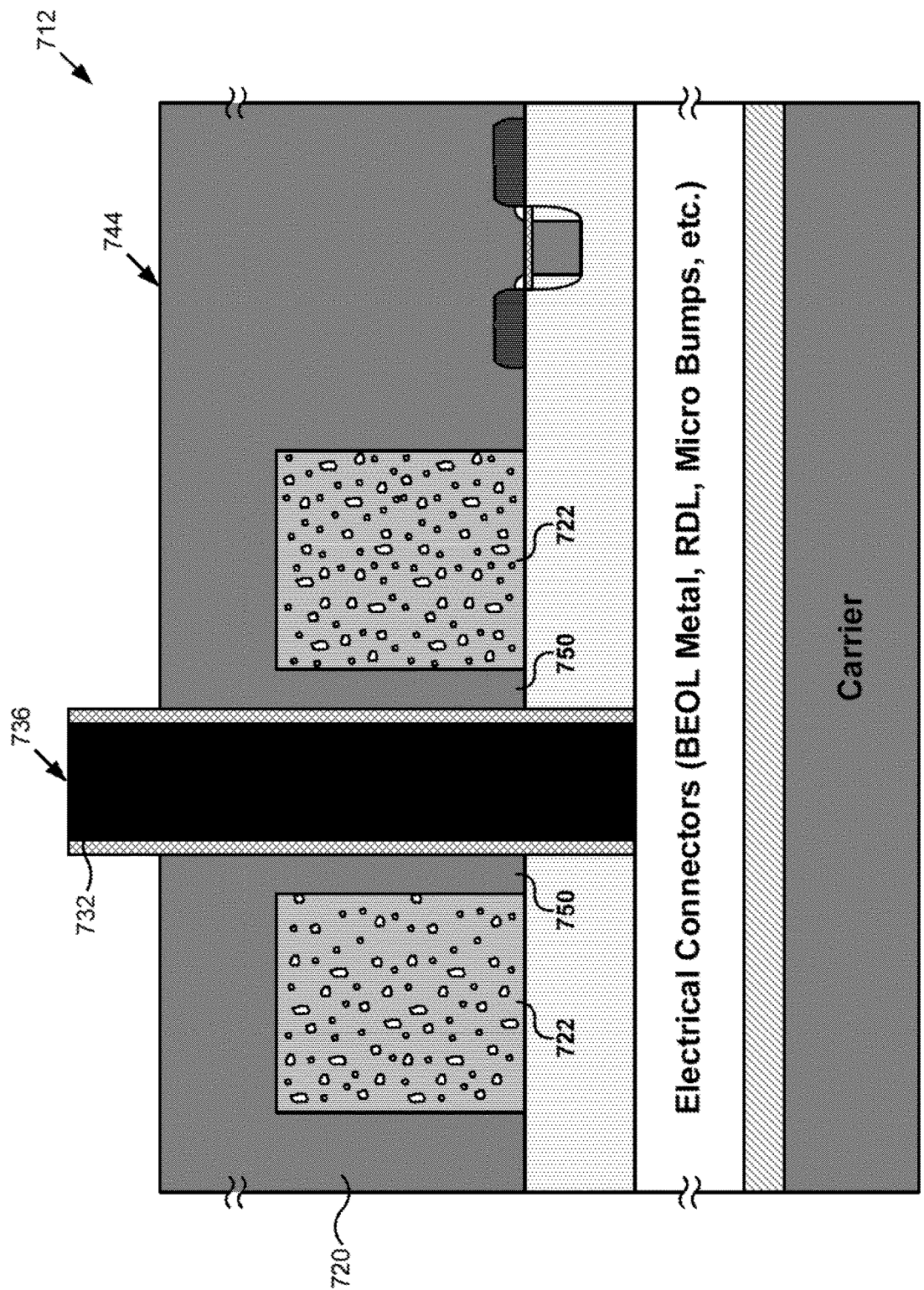
FIG. 7B illustrates a cross-sectional view of a portion of a semiconductor structure corresponding to the semiconductor structure in FIG. 7A according to one implementation of the present application.

FIG. 7B illustrates a cross-sectional view of a portion of a semiconductor structure corresponding to the semiconductor structure in FIG. 7A according to one implementation of the present application. As shown in FIG. 7B, in semiconductor structure 712, bulk silicon substrate 720 is etched, and back end 736 of TSV 732 is revealed from backside 744 of bulk silicon substrate 720.

As shown in FIG. 7A, prior to revealing back end 736 of TSV 732, the depth of porous silicon regions 722 in bulk silicon substrate 720 was less than the depth of TSV 732 in bulk silicon substrate 720. In one implementation, the depth of porous silicon regions 722 can be approximately ten microns (10 μm) less than the depth of TSV 732 to ensure that porous silicon regions 722 are not damaged in the reveal action.

As a result, after revealing back end 736 of TSV 732 as shown in FIG. 7B, porous silicon regions 722 remain substantially unetched. A portion of bulk silicon substrate 720 intervenes between porous silicon regions 722 and backside 744. Porous silicon regions 722 and silicon buffer ring 750 still improve the ability of semiconductor structure 712 and/or TSV 732 to withstand thermal and mechanical stresses. Moreover, porous silicon regions 722 do not absorb any etching solutions and provide increased reliability. Except for differences described above, semiconductor structure 712 in FIG. 7B generally corresponds to semiconductor structure 612 in FIG. 6G, and may have any implementations and advantages described above.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A semiconductor structure comprising:
   a semiconductor substrate;
   a porous semiconductor region within said semiconductor substrate, wherein said porous semiconductor region is not a dielectric material;
   a through-substrate via (TSV) within said porous semiconductor region;
   said porous semiconductor region causing said semiconductor structure and/or said TSV to withstand thermal and mechanical stresses.

2. The semiconductor structure of claim 1, wherein said porous semiconductor region has a first coefficient of thermal expansion (CTE) that is significantly greater than a second CTE of said semiconductor substrate.

3. The semiconductor structure of claim 1, wherein said porous semiconductor region is more deformable than said semiconductor substrate.

4. The semiconductor structure of claim 1, wherein a first depth of said porous semiconductor region is greater than or equal to a second depth of said TSV.

5. The semiconductor structure of claim 1, wherein a first depth of said porous semiconductor region is less than a second depth of said TSV.

6. The semiconductor structure of claim 1, further comprising at least one electrical connector situated over said TSV.

7. The semiconductor structure of claim 1, wherein said TSV comprises a metal selected from the group consisting of copper (Cu), aluminum (Al), and titanium (Ti).

8. The semiconductor structure of claim 1, further comprising a dielectric liner between said TSV and said porous semiconductor region.

9. A semiconductor structure comprising:
   a semiconductor substrate;
   a porous semiconductor region within said semiconductor substrate;
   a semiconductor buffer ring within said porous semiconductor region;
   a through-substrate via (TSV) within said semiconductor buffer ring;
   said porous semiconductor region and said semiconductor buffer ring causing said semiconductor structure and/or said TSV to withstand thermal and mechanical stresses.

10. The semiconductor structure of claim 9, wherein a first depth of said porous semiconductor region is greater than or equal to a second depth of said TSV.

11. The semiconductor structure of claim 9, wherein a first depth of said porous semiconductor region is less than a second depth of said TSV.

12. The semiconductor structure of claim 9, further comprising at least one electrical connector situated over said TSV.

13. A semiconductor structure comprising:
   a semiconductor substrate;
   a porous semiconductor region within said semiconductor substrate, wherein said porous semiconductor region is not a dielectric material;
   a through-substrate via (TSV) at least partially within said porous semiconductor region;
   said porous semiconductor region causing said semiconductor structure to withstand thermal or mechanical stress.

14. The semiconductor structure of claim 13, wherein said porous semiconductor region has a first coefficient of thermal expansion (CTE) that is greater than a second CTE of said semiconductor substrate.

15. The semiconductor structure of claim 13, wherein said TSV is completely within said porous semiconductor region.

16. The semiconductor structure of claim 13, wherein said TSV extends beyond said porous semiconductor region.

17. The semiconductor structure of claim 13, further comprising a dielectric liner between said TSV and said porous semiconductor region.

18. A semiconductor structure comprising:
a semiconductor substrate;
a porous semiconductor region within said semiconductor substrate;
a semiconductor buffer ring within said porous semiconductor region;
a through-substrate via (TSV) at least partially within said semiconductor buffer ring;
said porous semiconductor region or said semiconductor buffer ring causing said semiconductor structure to withstand thermal or mechanical stress.

19. The semiconductor structure of claim 18, wherein said TSV is completely within said semiconductor buffer ring.

20. The semiconductor structure of claim 18, wherein said TSV extends beyond said semiconductor buffer ring.

21. The semiconductor structure of claim 18, further comprising a dielectric liner between said TSV and said semiconductor buffer ring.

\* \* \* \* \*